United States Patent
Shimizu

(10) Patent No.: US 10,948,522 B2
(45) Date of Patent: Mar. 16, 2021

(54) CURRENT SENSOR AND CURRENT SENSOR UNIT

(71) Applicant: Murata Manufacturing Co., Ltd., Nagaokakyo (JP)

(72) Inventor: Yasuhiro Shimizu, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 189 days.

(21) Appl. No.: 16/274,292

(22) Filed: Feb. 13, 2019

(65) Prior Publication Data
US 2019/0178917 A1 Jun. 13, 2019

Related U.S. Application Data

(63) Continuation of application No. PCT/JP2017/022869, filed on Jun. 21, 2017.

(30) Foreign Application Priority Data
Dec. 1, 2016 (JP) ............................. JP2016-234384

(51) Int. Cl.
G01R 15/20 (2006.01)
G01R 33/07 (2006.01)
G01R 19/00 (2006.01)

(52) U.S. Cl.
CPC ......... *G01R 15/202* (2013.01); *G01R 15/20* (2013.01); *G01R 15/205* (2013.01); *G01R 19/0092* (2013.01); *G01R 33/07* (2013.01)

(58) Field of Classification Search
None
See application file for complete search history.

(56) References Cited

U.S. PATENT DOCUMENTS

| | | | |
|---|---|---|---|
| 2014/0070801 A1* | 3/2014 | Tamura | G01R 15/20 324/244 |
| 2015/0160267 A1* | 6/2015 | Juds | G01R 15/202 324/117 H |
| 2016/0033557 A1 | 2/2016 | Hwangbo | |

FOREIGN PATENT DOCUMENTS

| | | |
|---|---|---|
| JP | 2000-292455 A | 10/2000 |
| JP | 2007-113965 A | 5/2007 |
| JP | 4434111 B2 | 3/2010 |
| JP | 2012-242082 A | 12/2012 |
| JP | 2013-117447 A | 6/2013 |

OTHER PUBLICATIONS

Official Communication issued in International Patent Application No. PCT/JP2017/022869, dated Aug. 29, 2017.

* cited by examiner

*Primary Examiner* — Jas A Sanghera
(74) *Attorney, Agent, or Firm* — Keating & Bennett, LLP

(57) ABSTRACT

A current sensor includes a conductor including first and second flow path portions that are branched, the first flow path portion being a portion in which a portion of a current to be measured flows and the second flow path portion being a portion in which another portion of the current flows, a first magnetic sensor to detect a strength of a first magnetic field generated by the current flowing in the first flow path portion, a second magnetic sensor to detect a strength of a second magnetic field generated by the current flowing in the second flow path portion, and magnetic shield bodies between the first and second flow path portions and between the first and second magnetic sensors.

20 Claims, 26 Drawing Sheets

CURRENT SENSOR AND CURRENT SENSOR UNIT

CROSS REFERENCE TO RELATED APPLICATIONS

This application claims the benefit of priority to Japanese Patent Application No. 2016-234384 filed on Dec. 1, 2016 and is a Continuation Application of PCT Application No. PCT/JP2017/022869 filed on Jun. 21, 2017. The entire contents of each of these applications are hereby incorporated herein by reference.

BACKGROUND OF THE INVENTION

1. Field of the Invention

The present invention relates to a current sensor that detects a magnitude of a current by detecting a strength of a magnetic field generated by the current.

2. Description of the Related Art

Japanese Unexamined Patent Application Publication No. 2013-117447 discloses a current sensor for detecting a magnitude of a current to be measured flowing in a conductor to be measured. This current sensor includes a conductor to be measured in which a current to be measured flows, a magnetoelectric conversion element which is stationary with respect to the conductor to be measured, and a magnetic shield body which magnetically shields the magnetoelectric conversion element. The magnetic shield body has an annular surrounding portion which surrounds the conductor to be measured and the magnetoelectric conversion element in the inside thereof, and a gap for suppressing magnetic saturation is formed on the annular surrounding portion. To a magnetic shield portion, a magnetic field to be measured generated from the conductor to be measured in the inside is collected, and an external magnetic field is collected. Thus, it is possible to reduce the influence of a disturbance magnetic field.

Japanese Patent No. 4434111 discloses a current sensor for detecting a magnitude of a current flowing in a busbar. The busbar includes two parallel lines arranged at different positions in a thickness direction thereof. The current sensor includes two Hall elements. The two Hall elements are arranged so as to be sandwiched between the two lines in the thickness direction of the busbar, and detect strengths of magnetic fields generated in accordance with currents flowing in the two lines, respectively. Then, the current sensor differentially amplifies output voltages of the two Hall elements. Thus, it is possible to reduce the influence of the disturbance magnetic field.

SUMMARY OF THE INVENTION

Preferred embodiments of the present invention provide current sensors and current sensor units that are each capable of reducing influences due to a disturbance magnetic field.

A current sensor according to a preferred embodiment of the present invention outputs an output signal based on a magnitude of a current to be measured. The current sensor includes a conductor including a first flow path portion and a second flow path portion that are branched, the first flow path portion being a portion in which a portion of the current to be measured flows and the second flow path portion being a portion in which another portion of the current other than the portion of the current flows, a first magnetic element which detects a strength of a first magnetic field generated by the current flowing in the first flow path portion, a second magnetic element which detects a strength of a second magnetic field generated by the current flowing in the second flow path portion, and a magnetic shield body that is disposed between the first flow path portion and the second flow path portion and between the first magnetic element and the second magnetic element, and includes a magnetic body material.

Further, a current sensor unit according to a preferred embodiment of the present invention includes a plurality of the current sensors according to a preferred embodiment of the present invention described above. The plurality of current sensors are disposed such that the respective conductors are arrayed in parallel or substantially in parallel.

According to preferred embodiments of the present invention, in current sensors and current sensor units, it is possible to reduce or prevent influences due to a disturbance magnetic field.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
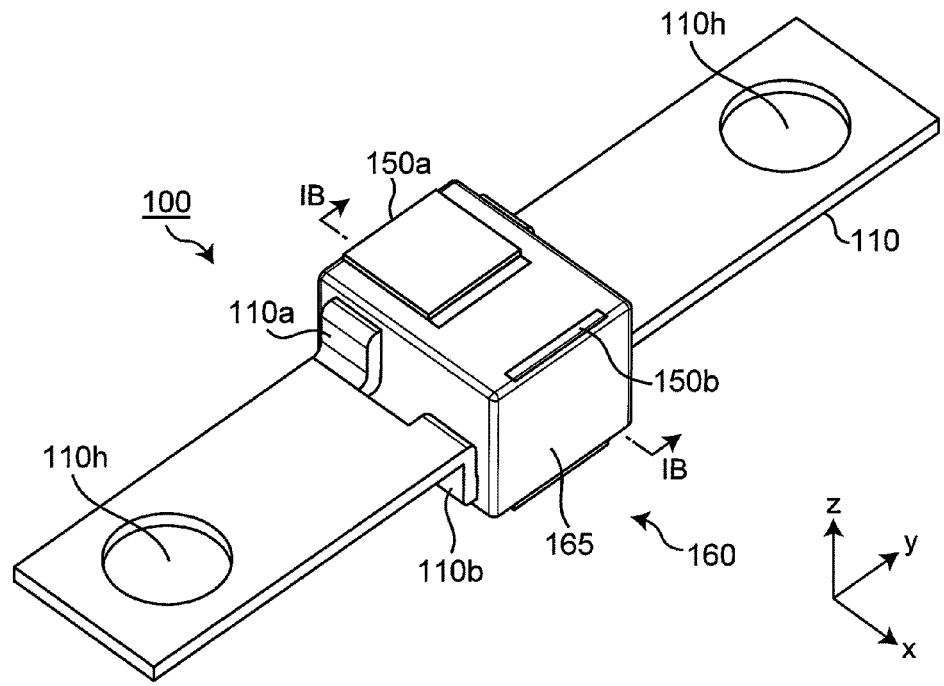
FIG. 1A is a perspective view illustrating an external appearance of a current sensor according to a first preferred embodiment of the present invention.

Hereinafter, preferred embodiments of current sensors according to the present invention will be described with reference to the accompanying drawings. Note that in each of the drawings, the same or corresponding portions will be denoted by the same reference numerals.

First Preferred Embodiment

Hereinafter, a current sensor according to a first preferred embodiment of the present invention will be described with reference to FIG. 1A to FIG. 8D.

Figure 1B:
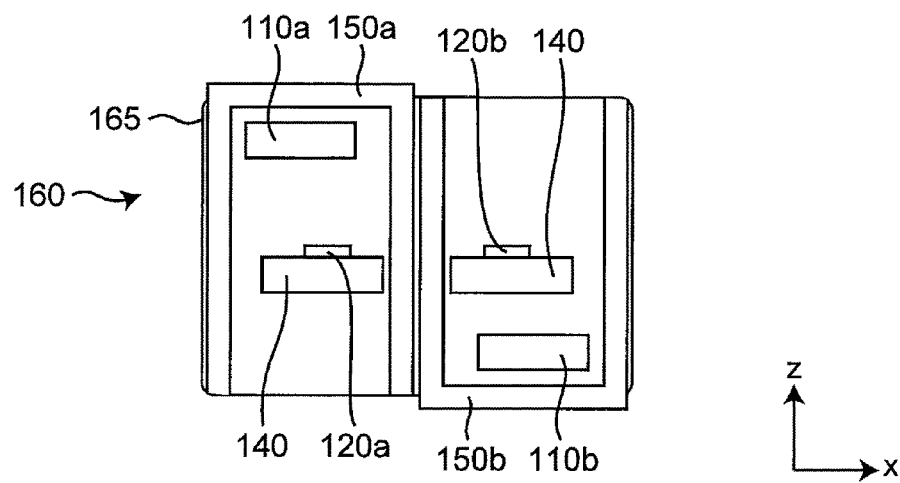
FIG. 1B is a cross-sectional view of the current sensor illustrated in FIG. 1A when viewed from a direction of arrows on a line IB-IB.
Figure 2A:
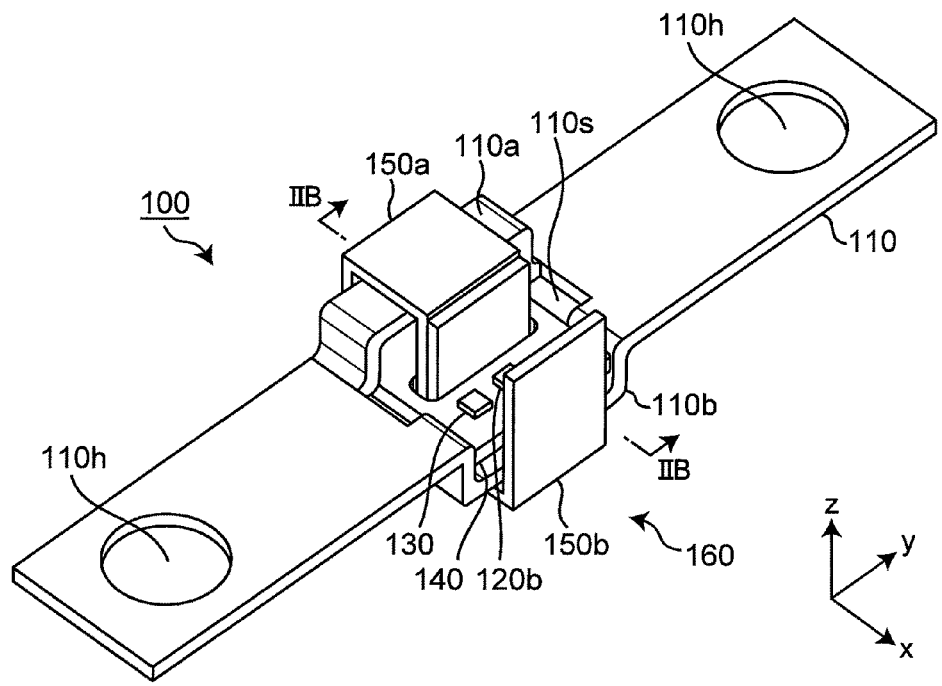
FIG. 2A is a perspective view illustrating an external appearance of the current sensor (a housing is not illustrated) according to the first preferred embodiment of the present invention.
Figure 2B:
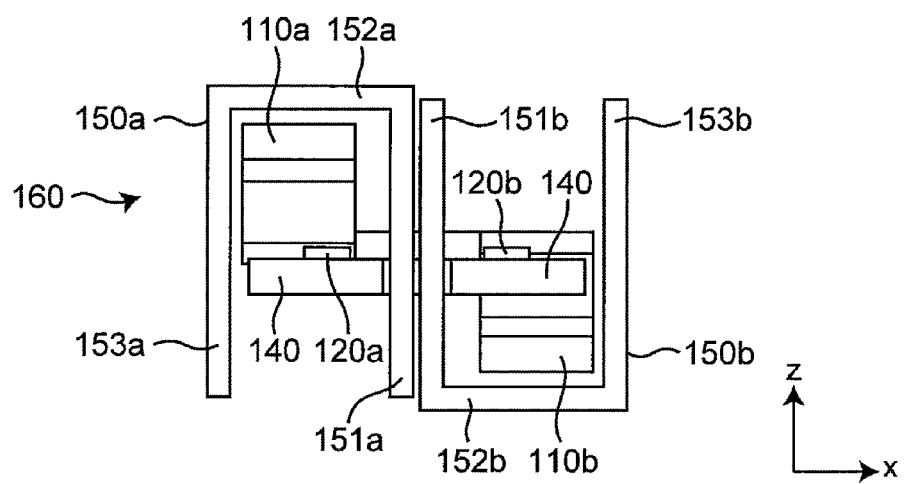
FIG. 2B is a cross-sectional view of the current sensor (the housing is not illustrated) illustrated in FIG. 2A when viewed from a direction of arrows on a line IIB-IIB.
Figure 3:
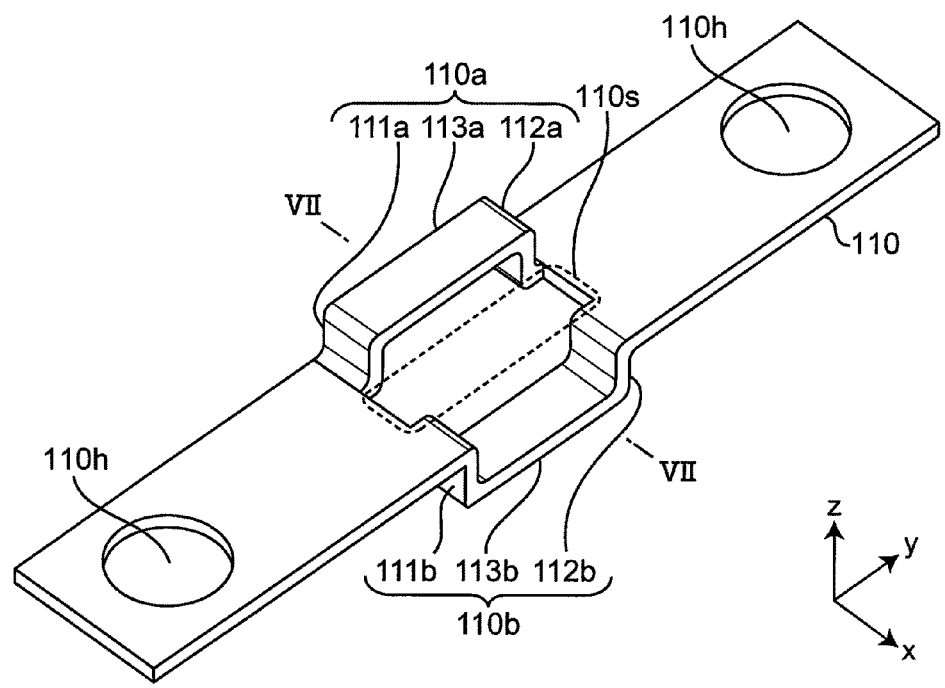
FIG. 3 is a perspective view illustrating an external appearance of a conductor of the current sensor illustrated in FIG. 2A.

FIG. 1A is a perspective view illustrating an external appearance of the current sensor according to the first preferred embodiment, and FIG. 1B is a cross-sectional view of the current sensor illustrated in FIG. 1A when viewed from a direction of arrows on a line IB-IB. FIG. 2A is a perspective view illustrating an external appearance of the current sensor (a housing is not illustrated) according to the first preferred embodiment, and FIG. 2B is a cross-sectional view of the current sensor (the housing is not illustrated) illustrated in FIG. 2A when viewed from a direction of arrows on a line IIB-IIB. FIG. 3 is a perspective view illustrating an external appearance of a conductor of the current sensor illustrated in FIG. 2A. In FIG. 1A to FIG. 3, an X-axis direction is a width direction of a conductor 110, which will be described later, a Y-axis direction is a length direction of the conductor 110, and a Z-axis direction is a thickness direction of the conductor 110.

As illustrated in FIG. 1A to FIG. 2B, a current sensor 100 according to the first preferred embodiment includes the conductor 110 and a magnetic sensor unit 160.

As illustrated in FIG. 2A and FIG. 3, the conductor 110 is preferably a plate-shaped conductor. Fixing holes 110h fixing and electrically connecting the current sensor 100 are provided at both end portions of the conductor 110 in the length direction (Y-axis direction), respectively.

The conductor 110 branches into a first flow path portion 110a and a second flow path portion 110b in a portion (in the middle) in the length direction (Y-axis direction). The first flow path portion 110a and the second flow path portion 110b are aligned in the width direction (X-axis direction) of the conductor 110. A slit 110s is provided between the first flow path portion 110a and the second flow path portion 110b. The slit 110s is positioned at the center or approximate center of the conductor 110 in the width direction (X-axis direction) of the conductor 110. The first flow path portion 110a protrudes toward one surface side (+Z direction side) of the conductor 110, and the second flow path portion 110b protrudes toward the other surface side (−Z direction side) of the conductor 110.

As illustrated in FIG. 3, the first flow path portion 110a includes a first protruding portion 111a and a second protruding portion 112a protruding, so as to be orthogonal or substantially orthogonal to one surface of the conductor 110, from the one surface, and a first extending portion 113a extending in the length direction of the conductor 110 (Y-axis direction) and connecting the first protruding portion 111a and the second protruding portion 112a More specifically, in the first flow path portion 110a, the first protruding portion 111a includes one end connected to one side on one end side of the slit 110s in a longitudinal direction, and protrudes from the one surface of the conductor 110 toward the opposite side from the other surface. The first extending portion 113a includes one end connected to the other end of the first protruding portion 111a, and extends in the longitudinal direction of the conductor 110 (Y-axis direction). The second protruding portion 112a includes one end connected to the other end of the first extending portion 113a, and the other end connected to one side on the other end side of the slit 110s in the longitudinal direction. The first flow path portion 110a preferably has a U shape or substantially U shape when viewed from the width direction of the conductor 110.

In the same or substantially the same manner, the second flow path portion 110b includes a third protruding portion 111b and a fourth protruding portion 112b protruding, so as to be orthogonal or substantially orthogonal to the other surface of the conductor 110, from the other surface, and a second extending portion 113b extending in the length direction of the conductor 110 (Y-axis direction) and connecting the third protruding portion 111b and the fourth protruding portion 112b. A positional relationship among the third protruding portion 111b, the fourth protruding portion 112b, and the second extending portion 113b in the second flow path portion 110b is the same or substantially the same as a positional relationship among the first protruding portion 111a, the second protruding portion 112a, and the first extending portion 113a in the first flow path portion 110a.

In the conductor 110, the first flow path portion 110a and the second flow path portion 110b protrude in opposite directions from each other, such that a space is provided by the first flow path portion 110a and the second flow path portion 110b. The magnetic sensor unit 160 is disposed in this space.

As a material of the conductor 110, a metal such as copper, silver, aluminum, or iron, an alloy including these metals, or other suitable material, for example, may preferably be used. Further, the conductor 110 may be subjected to a surface treatment. For example, at least one plating layer of a metal such as nickel, tin, silver, or copper, or an alloy including these metals may preferably be provided on a surface of the conductor 110. Further, the conductor 110 may be formed by casting, cutting, pressing, or other suitable method.

As illustrated in FIG. 1A to FIG. 2B, the magnetic sensor unit 160 includes, in a housing 165, a substrate 140 on which a first magnetic sensor 120a and a second magnetic sensor 120b, and electronic components, such as an amplifying portion 130, for example, are disposed, and a first magnetic shield portion 150a and a second magnetic shield portion 150b.

The housing 165 is preferably, for example, a resin mold having a rectangular or substantially rectangular parallelepiped shape. The housing 165 is structured such that the first extending portion 113a of the first flow path portion 110a (FIG. 3) and the second extending portion 113b of the second flow path portion 110b are fixed together with the aforementioned portions such as the substrate 140 and other portions inside the housing 165. Thus, a position of the first magnetic sensor 120a relative to the first flow path portion 110a and a position of the second magnetic sensor 120b relative to the second flow path portion 110b are easily set.

The housing 165 is made of an electrically insulating material. For example, the housing 165 is preferably made of an engineering plastic, such as PPS (polyphenylene sulfide). PPS has high heat resistance, and is therefore preferable as a material of the housing 165 when heat generation of the conductor 110 is taken into consideration.

The substrate 140 is fixed in the housing 165. The substrate 140 is a printed wiring board, and preferably includes for example, a base material, such as glass epoxy or alumina, and a wiring provided by patterning a metal foil, such as copper provided on a surface of the base material.

The first magnetic sensor 120a, the second magnetic sensor 120b, and electronic components, such as the amplifying portion 130, for example, are mounted on the substrate 140. These electronic components may be resin-packaged, or may be potted with a silicone resin, an epoxy resin, or other suitable material.

In the present preferred embodiment, each of the first magnetic sensor 120a and the second magnetic sensor 120b is resin-packaged and has a rectangular or substantially rectangular parallelepiped shape including a main surface. The first magnetic sensor 120a and the second magnetic sensor 120b have sensitivity axes in directions parallel or substantially parallel to the main surfaces thereof, respectively, for example. In this case, as the first magnetic sensor 120a and the second magnetic sensor 120b, an HSOP (High-Power Small Outline Package) component, an LQFP (Low Profile Quad Flat Package) component, and other suitable components, for example, may preferably are used, and the substrate 140 on which these components are mounted is disposed along an XY plane. On the substrate 140, the first and second magnetic sensors 120a and 120b are disposed such that the directions of the respective sensitivity axes are parallel or substantially parallel to the width direction of the conductor 110 (the first magnetic sensor 120a is in the +X direction and the second magnetic sensor 120b is in the −X direction) within an allowable error range as appropriate.

The first magnetic sensor 120a is positioned on the first flow path portion 110a side in the width direction (X-axis direction). The second magnetic sensor 120b is positioned on the second flow path portion 110b side in the width direction (X-axis direction). Thus, the first magnetic sensor 120a detects a strength of a first magnetic field generated by a current flowing in the first flow path portion 110a, and the second magnetic sensor 120b detects a strength of a second magnetic field generated by a current flowing in the second flow path portion 110b. In other words, the first magnetic sensor 120a and the second magnetic sensor 120b detect the strength of the magnetic fields generated by the current flowing in the conductor 110.

Note that the slit 110s between the first flow path portion 110a and the second flow path portion 110b is positioned midway between the first magnetic sensor 120a and the second magnetic sensor 120b in the width direction of the conductor 110 (X-axis direction). The width of the slit 110s may be adjusted as appropriate in order to adjust the strength of each of the magnetic fields input to these magnetic sensors.

The first magnetic shield portion 150a includes a first central side wall portion 151a, a first connecting wall portion 152a, and a first outer side wall portion 153a. Each of the first central side wall portion 151a, the first connecting wall portion 152a, and the first outer side wall portion 153a preferably has a flat plate shape. The first central side wall portion 151a and the first outer side wall portion 153a are parallel or substantially parallel to each other and face each other. The first connecting wall portion 152a is connected to the first central side wall portion 151a, and is also connected to the first outer side wall portion 153a. In other words, in the thickness direction of the conductor 110, a side edge portion of the first central side wall portion 151a and a side edge portion of the first outer side wall portion 153a are coupled to each other with the first connecting wall portion 152a. Thus, the first magnetic shield portion 150a preferably has a U-shaped or substantially U-shaped cross section.

The first magnetic shield portion 150a surrounds the first flow path portion 110a and the first magnetic sensor 120a in a U shape or substantially U shape, and is disposed such that the first connecting wall portion 152a is parallel or substantially parallel to the first flow path portion 110a.

Specifically, the first central side wall portion 151a intersects with a main surface of the conductor 110 and extends along the thickness direction of the conductor 110 through the slit 110s between the first flow path portion 110a and the second flow path portion 110b. Further, the first central side wall portion 151a is disposed between the first magnetic sensor 120a and the second magnetic sensor 120b. The first outer side wall portion 153a intersects with the main surface of the conductor 110 and faces the first central side wall portion 151a with the first flow path portion 110a and the first magnetic sensor 120a interposed therebetween. The first connecting wall portion 152a is parallel or substantially parallel to the main surface of the conductor 110 and faces the first magnetic sensor 120a with the first flow path portion 110a interposed therebetween.

In a same or similar manner, the second magnetic shield portion 150b includes a second central side wall portion 151b, a second connecting wall portion 152b, and a second outer side wall portion 153b. Each of the second central side wall portion 151b, the second connecting wall portion 152b, and the second outer side wall portion 153b preferably has a flat plate shape. The second central side wall portion 151b and the second outer side wall portion 153b face each other. The second connecting wall portion 152b is connected to the second central side wall portion 151b, and is also connected to the second outer side wall portion 153b. In other words, the second central side wall portion 151b and the second outer side wall portion 153b are coupled to each other with the second connecting wall portion 152b. Thus, the second magnetic shield portion 150b preferably has a U-shaped or substantially U-shaped cross section.

The second magnetic shield portion 150b surrounds the second flow path portion 110b and the second magnetic sensor 120b in a U shape or substantially U shape, and is disposed such that the second connecting wall portion 152b is parallel or substantially parallel to the second flow path portion 110b.

Specifically, the second central side wall portion 151b intersects with the main surface of the conductor 110, and through the slit 110s between the first flow path portion 110a and the second flow path portion 110b. Further, the second central side wall portion 151b is between the first magnetic sensor 120a and the second magnetic sensor 120b.

The second outer side wall portion 153b intersects with the main surface of the conductor 110 and faces the second central side wall portion 151b with the second flow path portion 110b and the second magnetic sensor 120b interposed therebetween. The second connecting wall portion 152b is parallel or substantially parallel to the main surface of the conductor 110 and faces the second magnetic sensor 120b with the second flow path portion 110b interposed therebetween.

Note that the second central side wall portion 151b of the second magnetic shield portion 150b may be disposed on a side of the second flow path portion 110b and the second magnetic sensor 120b farther than the first central side wall portion 151a of the first magnetic shield portion 150a, or may be disposed on a side of the first flow path portion 110a and the first magnetic sensor 120a farther than the first central side wall portion 151a.

As described above, as illustrated in FIG. 1B, in a cross section orthogonal or substantially orthogonal to the longitudinal direction of the conductor 110, the first magnetic sensor 120a and the second magnetic sensor 120b are disposed on one side and the other side, respectively, so as to face each other with the slit 110s interposed therebetween, and therefore are aligned in the width direction of the conductor 110. The first extending portion 113a of the first flow path portion 110a and the second extending portion 113b of the second flow path portion 110b (see FIG. 3) are respectively disposed on the one side and the other side with the slit 110s interposed therebetween and on an upper side and a lower side with the substrate 140, which is in parallel or substantially in parallel along the main surface of the conductor 110, interposed therebetween.

Further, as described above, the first magnetic shield portion 150a surrounds the first flow path portion 110a and the first magnetic sensor 120a in a U shape or substantially U shape, so that the first magnetic sensor 120a is between the first flow path portion 110a and an opening portion of the U shape or substantially U shape. In the same or similar manner, the second magnetic shield 150b surrounds the second flow path portion 110b and the second magnetic sensor 120b in a U shape or substantially U shape, so that the second magnetic sensor 120b is between the second flow path portion 110b and an opening portion of the U shape or substantially U shape. As a result, the first central side wall portion 151a and the second central side wall portion 151b are in parallel or substantially in parallel while facing each other in the width direction of the conductor 110.

Various magnetic body materials may be used for the materials of the first magnetic shield portion 150a and the second magnetic shield portion 150b, respectively. For example, for a material of each of the first magnetic shield portion 150a and the second magnetic shield portion 150b, a soft magnetic body material, such as PB permalloy, PC permalloy, 42Ni, a grain-oriented electrical steel sheet, a non-oriented electrical steel sheet, or iron may preferably be used. By using a material having high magnetic permeability, such as PB permalloy, PC permalloy, or 42Ni, it is possible to improve a magnetic shielding effect. Additionally, when a magnetic field in the magnetic shield is large, a material having a large magnetic field at the time of magnetic saturation, such as the non-oriented electrical steel sheet or the iron, for example, may preferably be used. Further, each of the first magnetic shield portion 150a and the second magnetic shield portion 150b may include a plurality of layers, and different materials may be used for the respective layers.

Figure 4:
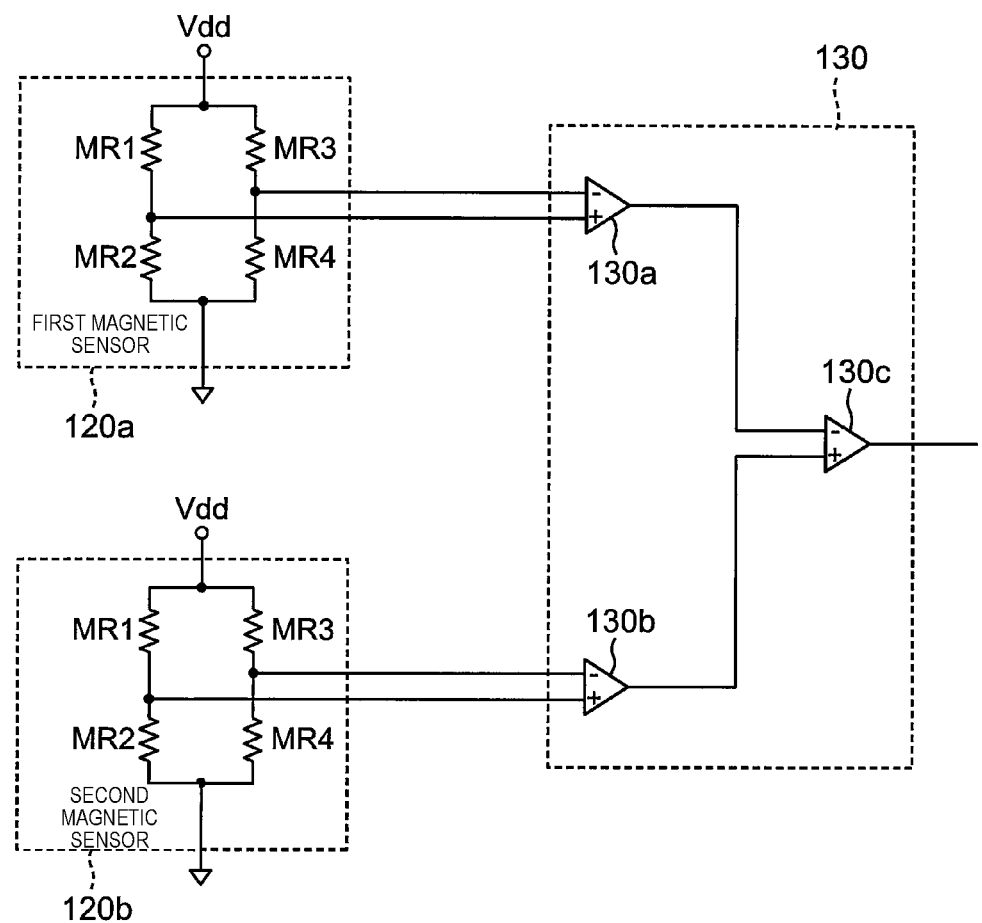
FIG. 4 is a block diagram illustrating an electrical configuration of a magnetic sensor unit in the current sensor illustrated in FIGS. 2A and 2B.

FIG. 4 is a block diagram illustrating an electrical configuration of the magnetic sensor unit 160 in the current sensor 100. As illustrated in FIG. 4, in the current sensor 100 according to the present preferred embodiment, each of the first magnetic sensor 120a and the second magnetic sensor 120b preferably has a Wheatstone bridge circuit including four magnetoresistive elements such as AMR (Anisotropic Magneto Resistance) elements, for example. In other words, in each of the first magnetic sensor 120a and the second magnetic sensor 120b, a series circuit of two magnetoresistive elements MR1 and MR2 and a series circuit of two magnetoresistive elements MR3 and MR4 are connected in parallel. Each of the first magnetic sensor 120a and the second magnetic sensor 120b is driven by constant voltage driving with a power supply voltage Vdd. Note that as a method of driving the first magnetic sensor 120a and the second magnetic sensor 120b, constant current driving, pulse driving, or other suitable driving, for example, may be used.

Each of the first magnetic sensor 120a and the second magnetic sensor 120b may include a half bridge circuit including two magnetoresistive elements. Further, each of the first magnetic sensor 120a and the second magnetic sensor 120b may include a magnetoresistive element such as GMR (Giant Magneto Resistance), TMR (Tunnel Magneto Resistance), BMR (Ballistic Magneto Resistance), or CMR (Colossal Magneto Resistance), for example, instead of the AMR element. Further, as the first magnetic sensor 120a and the second magnetic sensor 120b, a magnetic sensor including a Hall element, a magnetic sensor having an MI (Magneto Impedance) element using a magnetic impedance effect, a fluxgate type magnetic sensor, or other suitable element, for example, may be used.

The amplifying portion 130 differentially amplifies an output voltage of the first magnetic sensor 120a and an output voltage of the second magnetic sensor 120b, and outputs the result as an output voltage of the current sensor 100. The amplifying portion 130 includes a plurality of amplifiers 130a, 130b, and 130c.

A negative input terminal of the amplifier 130a is connected to a connection point between the magnetoresistive element MR3 and the magnetoresistive element MR4 in the first magnetic sensor 120a, and a positive input terminal of the amplifier 130a is connected to a connection point between the magnetoresistive element MR1 and the magnetoresistive element MR2 in the first magnetic sensor 120a. The amplifier 130a amplifies the output voltage of the first magnetic sensor 120a.

A negative input terminal of the amplifier 130b is connected to a connection point between the magnetoresistive element MR3 and the magnetoresistive element MR4 in the second magnetic sensor 120b, and a positive input terminal of the amplifier 130b is connected to a connection point between the magnetoresistive element MR1 and the magnetoresistive element MR2 in the second magnetic sensor 120b. The amplifier 130b amplifies the output voltage of the second magnetic sensor 120b.

A negative input terminal of the amplifier 130c is connected to an output terminal of the amplifier 130a, and a positive input terminal of the amplifier 130c is connected to an output terminal of the amplifier 130b. The amplifier 130c differentially amplifies the output voltage of the amplifier 130a and the output voltage of the amplifier 130b.

Operations of the current sensor 100 described above will be described below.

Figure 5:
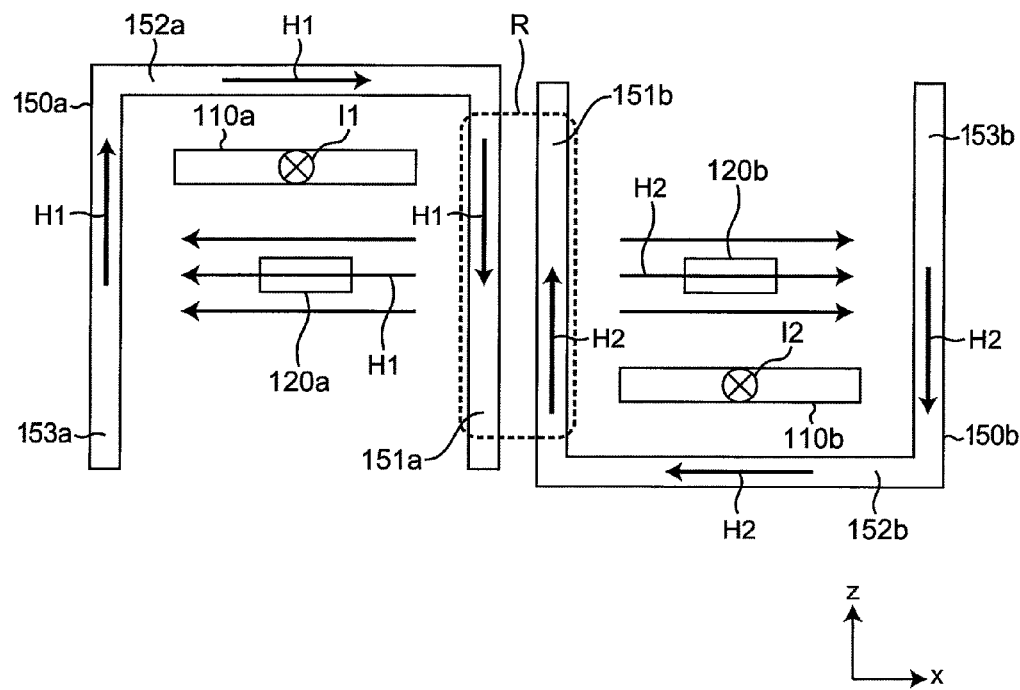
FIG. 5 is a diagram for explaining a magnetic field observed in the current sensor according to the first preferred embodiment of the present invention.

FIG. 5 is a diagram for explaining a magnetic field observed in the current sensor 100. FIG. 5 illustrates a cross section of the current sensor 100 when viewed from a direction of arrows on the line IIB-IIB in FIG. 2A. For convenience of explanation, FIG. 5 illustrates only the first flow path portion 110a and the second flow path portion 110b, the first magnetic sensor 120a and the second magnetic sensor 120b, and the first magnetic shield portion 150a and the second magnetic shield portion 150b of the current sensor 100.

When a current to be measured flows in the conductor 110 in the length direction (Y-axis direction), this current is divided into two currents flowing in the first flow path portion 110a and the second flow path portion 110b, respectively. In other words, a portion of the current to be measured flows in the first flow path portion 110a, and a remaining current of the current to be measured flows in the second flow path portion 110b.

As illustrated in FIG. 5, a first magnetic field H1 which circulates around the first flow path portion 110a is generated by a current I1 flowing in the first flow path portion 110a. The first magnetic field H1 is collected to the first outer side wall portion 153a, the first connecting wall portion 152a, and the first central side wall portion 151a of the first magnetic shield portion 150a, and is guided to the first magnetic sensor 120a. The first magnetic sensor 120a detects the strength of the first magnetic field H1, and outputs a voltage based on the strength of the first magnetic field H1. Due to the first magnetic shield portion 150a, magnetic flux density intensity input to the first magnetic sensor 120a increases as compared with a case in which the first magnetic shield portion 150a is not used (note that the "magnetic flux density intensity" refers to an absolute value of a component in a predetermined direction (e.g., a sensitivity axis direction) in a vector field of the magnetic flux density).

Additionally, a second magnetic field H2 which circulates around the second flow path portion 110b is generated by a current I2 flowing in the second flow path portion 110b. The second magnetic field H2 is collected to the second outer side wall portion 153b, the second connecting wall portion 152b, and the second central side wall portion 151b of the second magnetic shield portion 150b, and is guided to the second magnetic sensor 120b. The second magnetic sensor 120b detects the strength of the second magnetic field H2, and outputs a voltage based on the strength of the second magnetic field.

The amplifying portion 130 differentially amplifies the output voltage of the first magnetic sensor 120a and the output voltage of the second magnetic sensor 120b. Thus, the current sensor 100 outputs a voltage based on the magnitude of the current flowing in the conductor 110.

As described above, the current sensor 100 of the present preferred embodiment differentially amplifies the output voltage of the first magnetic sensor 120a and the output voltage of the second magnetic sensor 120b. This makes it possible, as compared with a case in which one magnetic sensor is used, to improve the detection sensitivity. Further, in the present preferred embodiment, by using the differential amplification, it is possible to reduce common mode noise caused by a disturbance magnetic field, such as the magnetic field generated by the current flowing in the conductor which is disposed to be adjacent. Thus, the current sensor 100 of the present preferred embodiment is able to reduce the influence of the disturbance magnetic field while improving the sensitivity to the current to be measured flowing in the conductor 110.

Here, a process in which the present disclosure has been conceived will be described. Preferred embodiments of the present invention further reduce the influence of the disturbance magnetic field and further improve the sensitivity to the current to be measured flowing in the conductor 110. In order to achieve this, the inventor of preferred embodiments of the present invention initially studied a configuration of a current sensor as illustrated in FIG. 6.

Figure 6:
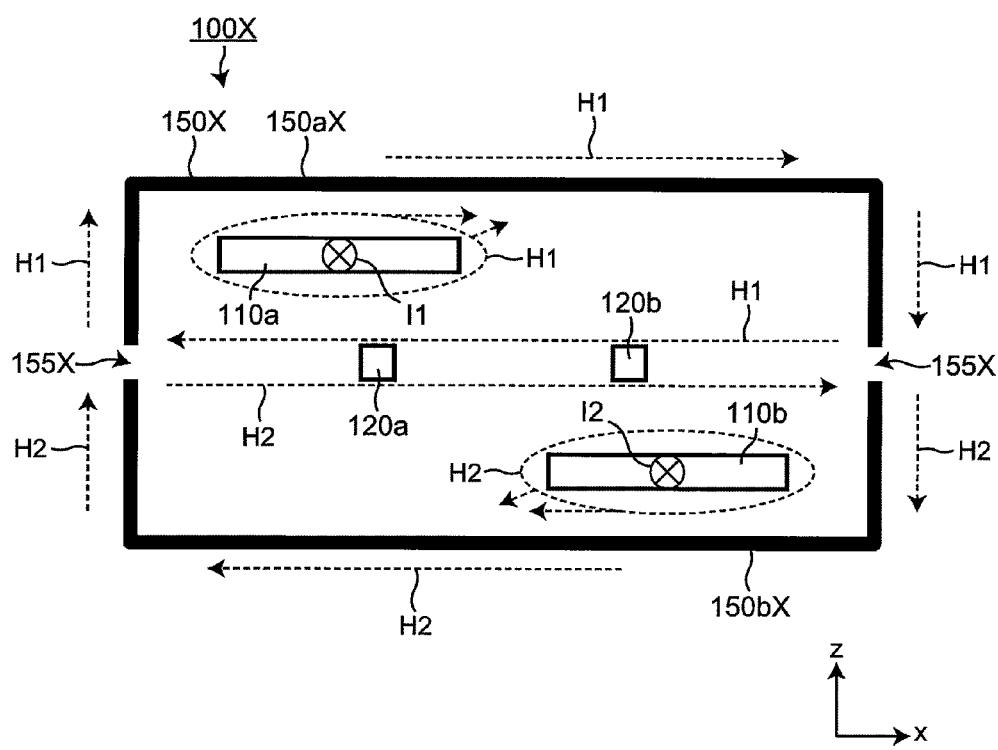
FIG. 6 is a cross-sectional view of a current sensor of a comparative example.

In a current sensor 100X illustrated in FIG. 6, the conductor 110 including the first flow path portion 110a and the second flow path portion 110b which are branched, the first magnetic sensor 120a, the second magnetic sensor 120b, and the amplifying portion 130 (not illustrated) are surrounded by an annular or substantially annular magnetic shield portion 150X as disclosed in Japanese Patent No. 4434111. Gaps 155X to reduce or prevent magnetic saturation are provided in the magnetic shield portion 150X.

A first magnetic shield portion 150aX of the magnetic shield portion 150X collects the first magnetic field (signal magnetic field) H1 generated by the current I1 flowing in the first flow path portion 110a. The first magnetic field H1 which has been collected circulates, by crossing the inside of the magnetic shield portion 150X at the gaps 155X, around the first flow path portion 110a. At this time, a portion of the magnetic flux corresponding to the first magnetic field H1 is collected to a second magnetic shield portion 150bX having a low magnetic resistance. The first magnetic sensor 120a detects the first magnetic field (signal magnetic field) H1 that crosses the inside of the magnetic shield portion 150X at the gaps 155X.

In the same or similar manner, the second magnetic shield portion 150bX of the magnetic shield portion 150X collects the second magnetic field (signal magnetic field) H2 generated by the current I2 flowing in the second flow path portion 110b. The second magnetic field H2 which has been collected circulates, by crossing the inside of the magnetic shield portion 150X at the gaps 155X, around the second flow path portion 110b. At this time, a portion of the magnetic flux corresponding to the second magnetic field H2 is collected to the second magnetic shield portion 150bX having a low magnetic resistance, and the remaining magnetic flux is collected to the first magnetic shield portion 150aX. The second magnetic sensor 120b detects the second magnetic field (signal magnetic field) H2 that crosses the inside of the magnetic shield portion 150X at the gaps 155X.

In such a configuration of the magnetic shield portion 150X, magnetic saturation (a state in which the magnetic flux density intensity increases and the magnetic permeability drops in the magnetic body) due to the collected first magnetic field and second magnetic field (signal magnetic fields) is generated, and a shielding effect of the disturbance magnetic field deteriorates. In order to prevent the magnetic saturation, there is a method of increasing the thickness of the magnetic shield or enlarging the gap, but either method causes an increase in the size of the apparatus and is therefore not preferable.

Further, since the direction of the first magnetic field H1 and the direction of the second magnetic field H2 crossing the inside of the magnetic shield portion 150X at the gaps 155X are opposite to each other, the first magnetic field H1 and the second magnetic field H2 weaken each other. Therefore, the magnetic field (signal magnetic field) input to each of the first magnetic sensor 120a and the second magnetic sensor 120b is weakened, and the sensitivity to the current to be measured decreases.

In order to solve the above-described problem, the inventor of preferred embodiments of the present invention has performed the following magnetic field analysis.

Figure 7:
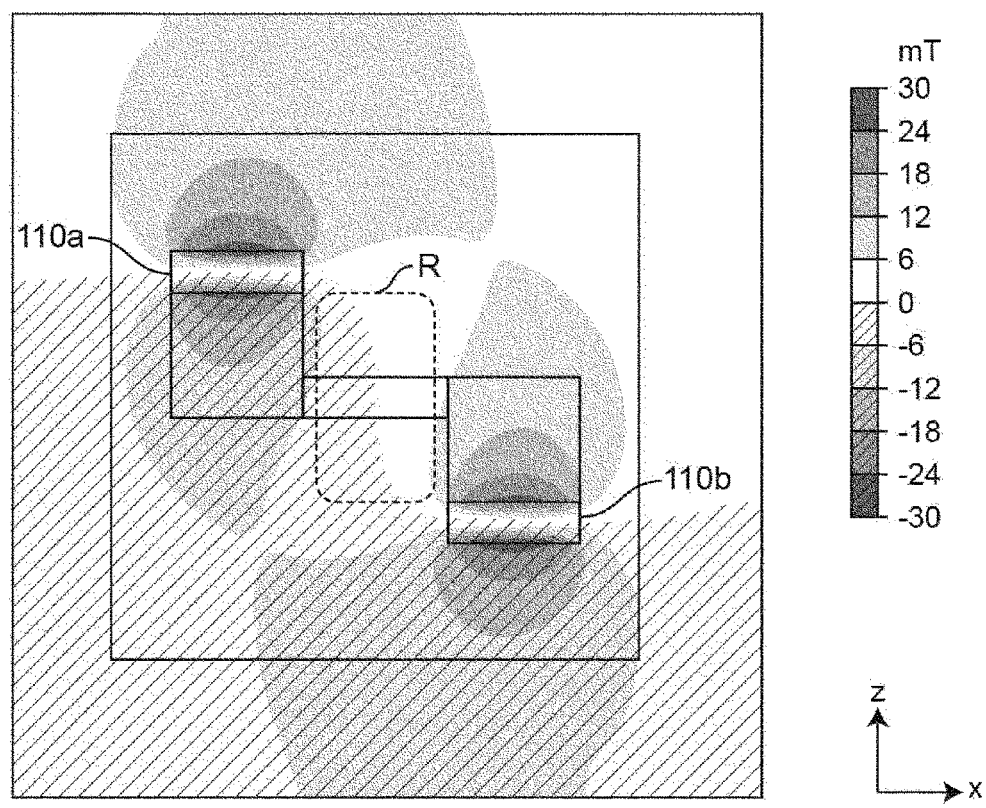
FIG. 7 shows a result of magnetic field analysis when a current is supplied to the conductor illustrated in FIG. 3, and is a contour diagram of magnetic flux density intensity in an X direction on a ZX plane including a line VII-VII.

FIG. 7 shows a result of the magnetic field analysis when a current is supplied to the conductor 110 illustrated in FIG. 3, and is a contour diagram of the magnetic flux density intensity (an isopleth distribution chart of the magnetic flux density) in the X direction on a ZX plane including a line VII-VII. In this magnetic field analysis, a current of 500 A was caused to flow in the conductor 110.

According to the analysis result shown in FIG. 7, it is understood that the magnetic flux density intensity (the magnitude of the magnetic field) is small in a region R between the first flow path portion 110a and the second flow path portion 110b in the X direction. In the region R, the direction of the magnetic flux caused by the first magnetic field (signal magnetic field) generated by the current flowing in the first flow path portion 110a and the direction of the magnetic flux caused by the second magnetic field (signal magnetic field) generated by the current flowing in the second flow path portion 110b are opposite to each other (see the region R in FIG. 5). Therefore, the first magnetic field and the second magnetic field cancel each other, and the magnetic flux density intensity of the signal magnetic field is reduced.

From this analysis result, the inventor of preferred embodiments of the present invention discovered that, in the region R, since the magnetic flux density intensity is reduced, the magnetic saturation of the magnetic body is able to be reduced or prevented (that is, by reducing the magnetic flux density intensity in the magnetic body, the magnetic permeability is able to be reduced or prevented from decreasing). Then, the inventor of preferred embodiments of the present invention provided the magnetic shield portion in the region between the first flow path portion 110a and the second flow path portion 110b, in which the magnetic saturation of the magnetic body is reduced or prevented. Further, the inventor of preferred embodiments of the present invention surrounded each of the first flow path portion 110a and the second flow path portion 110b by the magnetic shield body in a U shape or substantially U shape.

Next, in order to verify the advantageous effects of the magnetic shield portion in the current sensor, the inventor of preferred embodiments of the present invention has performed the following magnetic field analysis.

Figure 8A:
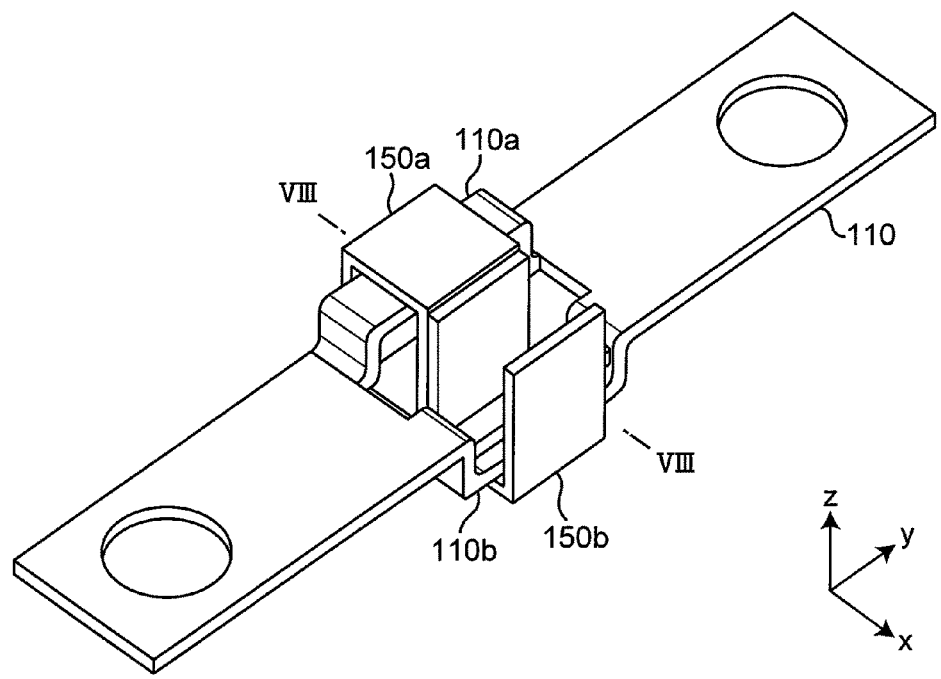
FIG. 8A is a diagram illustrating a configuration in which a first magnetic shield portion and a second magnetic shield portion of the first preferred embodiment of the present invention are further disposed on the conductor illustrated in FIG. 3.

FIG. 8A is a diagram illustrating a configuration in which the first magnetic shield portion 150a and the second magnetic shield portion 150b of the present preferred embodiment are further provided on the conductor 110 illustrated in FIG. 3. As a material of the first magnetic shield portion 150a and the second magnetic shield portion 150b, silicon steel, for example, is preferably used, and the thicknesses thereof are each set to about 1 mm, for example.

Figure 8B:
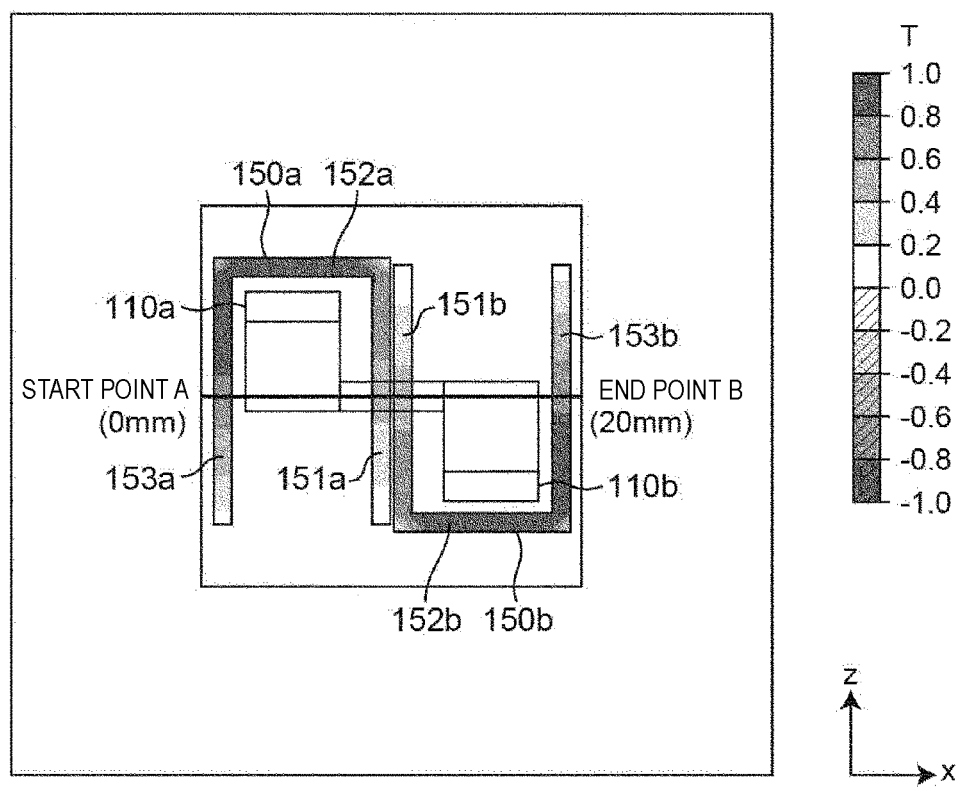
FIG. 8B shows a result of magnetic field analysis when a current is supplied to the conductor in the configuration illustrated in FIG. 8A, and is a contour diagram of magnetic flux density intensity only of the first magnetic shield portion and the second magnetic shield portion on the ZX plane including a line VIII-VIII.
Figure 8C:
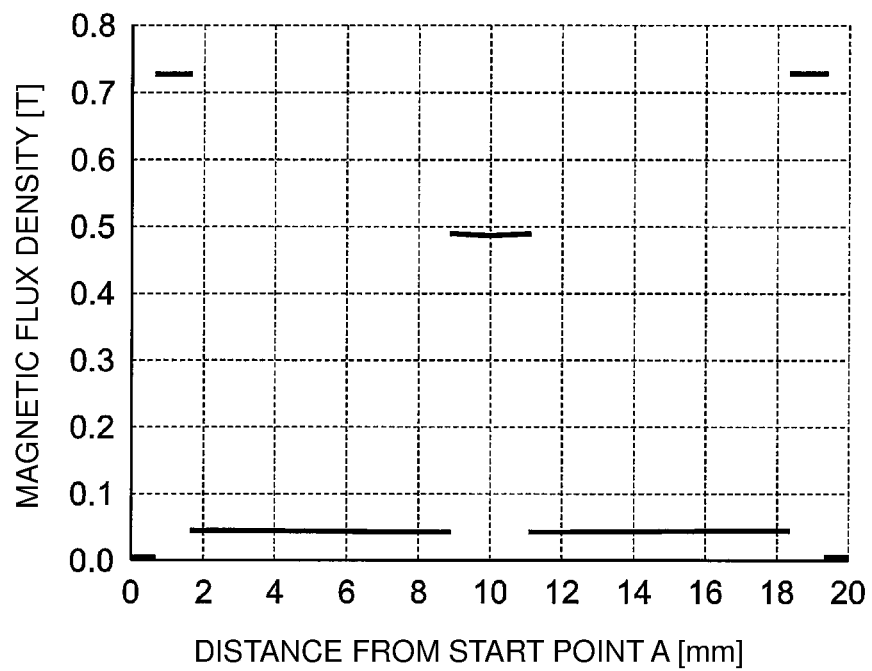
FIG. 8C is a graph showing magnitude of a magnetic flux density along a line A-B in FIG. 8B.
Figure 8D:
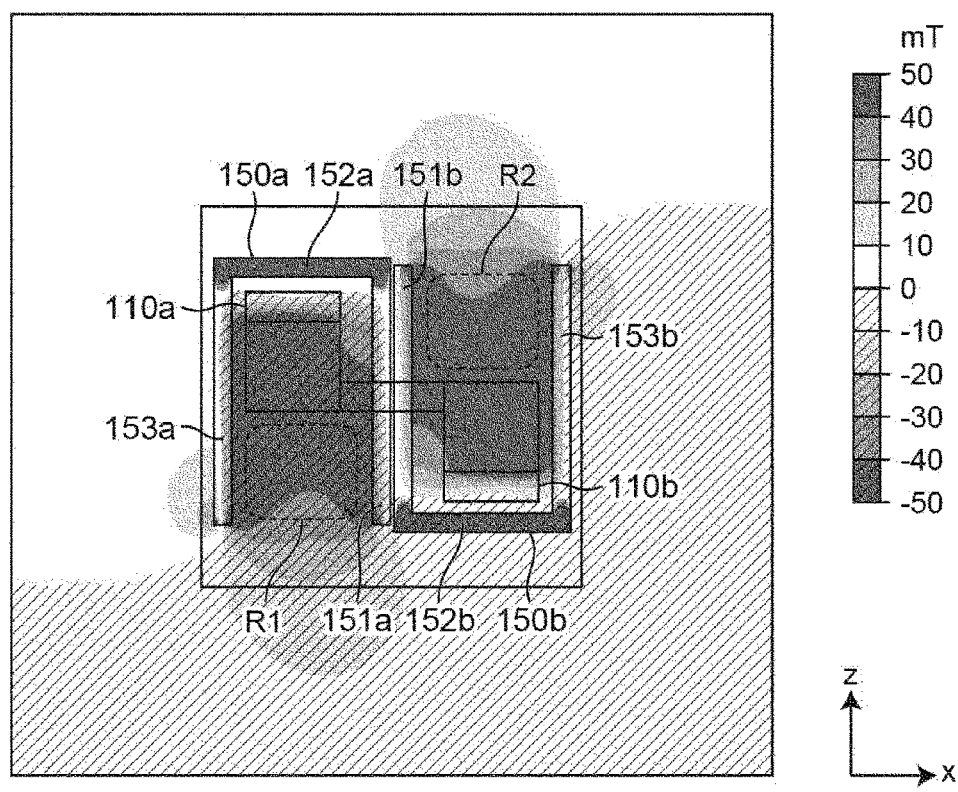
FIG. 8D shows a result of magnetic field analysis when a current is supplied to the conductor in the configuration illustrated in FIG. 8A, and is a contour diagram of magnetic flux density intensity in the X direction on the ZX plane including the line VIII-VIII.

FIG. 8B shows a result of the magnetic field analysis when a current is supplied to the conductor 110 in the configuration illustrated in FIG. 8A, and is a contour diagram of the magnetic flux density intensity only of the first magnetic shield portion 150a and the second magnetic shield portion 150b on the ZX plane including a line VIII-VIII. FIG. 8C is a graph showing the magnitude of a magnetic flux density along a line A-B in FIG. 8B. FIG. 8D shows a result of the magnetic field analysis when a current is supplied to the conductor 110 in the configuration illustrated in FIG. 8A, and is a contour diagram of the magnetic flux density intensity in the X direction on the ZX plane including the line VIII-VIII. In this magnetic field analysis as well, a current of about 500 A, for example, flowed in the conductor 110.

According to the analysis results in FIGS. 8B and 8C, it was discovered that, in the first magnetic shield portion 150a, the magnetic flux in the first central side wall portion 151a is smaller than the magnetic flux in each of the first connecting wall portion 152a and the first outer side wall portion 153a. Additionally, it was discovered that, in the second magnetic shield portion 150b, the magnetic flux in the second central side wall portion 151b is smaller than the magnetic flux in each of the second connecting wall portion 152b and the second outer side wall portion 153b. As described above, in the region between the first flow path portion 110a and the second flow path portion 110b, the direction of the magnetic flux caused by the first magnetic field (signal magnetic field) generated by the current flowing in the first flow path portion 110a and the direction of the magnetic flux caused by the second magnetic field (signal magnetic field) generated by the current flowing in the second flow path portion 110b are opposite to each other. Therefore, the first magnetic field and the second magnetic field cancel each other, and the magnetic flux density intensity of the signal magnetic field is reduced. Accordingly, it is possible to reduce or prevent the magnetic saturation of the magnetic body in the region between the first flow path portion 110a and the second flow path portion 110b.

In the present preferred embodiment, the first central side wall portion 151a of the first magnetic shield portion 150a and the second central side wall portion 151b of the second magnetic shield portion 150b are disposed in the region between the first flow path portion 110a and the second flow path portion 110b, in which the magnetic saturation of the magnetic body is reduced or prevented. Therefore, the magnetic saturation of the first central side wall portion 151a and the second central side wall portion 151b is able to be reduced of prevented, and it is possible to reduce or prevent the magnetic permeability of the first central side wall portion 151a and the second central side wall portion 151b from decreasing and the ability to collect the disturbance magnetic field from deteriorating. Accordingly, the disturbance magnetic field is collected to the first central side wall portion 151a and the second central side wall portion 151b, and is reduced or prevented from being input to the first magnetic sensor 120a and the second magnetic sensor 120b. This makes it possible to reduce or prevent the influence of the disturbance magnetic field in a state in which the magnetic saturation is reduced or prevented.

According to the analysis result in FIG. 8D, it was discovered that (the magnetic flux density intensity of) the signal magnetic field in a region R1 surrounded by the first magnetic shield portion 150a and a region R2 surrounded by the second magnetic shield portion 150b is strong. The first outer side wall portion 153a, the first connecting wall portion 152a, and the first central side wall portion 151a of the first magnetic shield portion 150a surround the first flow path portion 110a in a U shape or substantially U shape, collect the first magnetic field (signal magnetic field) generated by the current flowing in the first flow path portion 110a, and guide it to the region R1. By disposing the first magnetic sensor 120a in the region R1, the first magnetic field (signal magnetic field) input to the first magnetic sensor 120a is able to be strengthened. The same applies to the signal magnetic field in the region R2 of the second magnetic shield portion 150b. Therefore, it is possible to improve the sensitivity to the current to be measured flowing in the conductor.

Additionally, according to the analysis result in FIG. 8D, it was discovered that (the magnetic flux density intensity of) the signal magnetic field in the outer side portion of the first magnetic shield portion 150a and the second magnetic shield portion 150b decreases. This is because the first outer side wall portion 153a, the first connecting wall portion 152a, and the first central side wall portion 151a of the first magnetic shield portion 150a collect the first magnetic field (signal magnetic field), and the second outer side wall portion 153b, the second connecting wall portion 152b, and the second central side wall portion 151b of the second magnetic shield portion 150b collect the second magnetic field (signal magnetic field). Therefore, it is possible to reduce or prevent the signal magnetic field from being emitted to the outside as the disturbance magnetic field.

As described above, in the current sensor 100 of the present preferred embodiment, the first central side wall portion 151a of the first magnetic shield portion 150a and the second central side wall portion 151b of the second magnetic shield portion 150b are disposed between the first flow path portion 110a and the second flow path portion 110b and between the first magnetic sensor 120a and the second magnetic sensor 120b.

In this manner, in the present preferred embodiment, the first central side wall portion 151a and the second central side wall portion 151b are disposed in the region between the first flow path portion 110a and the second flow path portion 110b, at which the magnetic saturation of the magnetic body is reduced or prevented. Therefore, the magnetic saturation of the first central side wall portion 151a and the second central side wall portion 151b is able to be reduced or prevented, and it is possible to reduce or prevent the ability to collect the disturbance magnetic field from decreasing due to the magnetic saturation of the first central side wall portion 151a and the second central side wall portion 151b. Accordingly, the disturbance magnetic field is collected to the first central side wall portion 151a and the second central side wall portion 151b, and is reduced or prevented from being input to the first magnetic sensor 120a and the second magnetic sensor 120b. This makes it possible to reduce or prevent the influence of the disturbance magnetic field in a state in which the magnetic saturation is reduced of prevented.

In addition, in the current sensor 100 of the present preferred embodiment, the first magnetic shield portion 150a further includes the first connecting wall portion 152a and the first outer side wall portion 153a in addition to the first central side wall portion 151a, and has a U-shaped or substantially U-shaped cross section. The first connecting wall portion 152a faces the first magnetic sensor 120a with the first flow path portion 110a interposed therebetween, and is connected to the first central side wall portion 151a. The first outer side wall portion 153a faces the first central side wall portion 151a with the first flow path portion 110a and the first magnetic sensor 120a interposed therebetween, and is connected to the first connecting wall portion 152a.

With this configuration, in the current sensor 100 of the present preferred embodiment, the first outer side wall portion 153a, the first connecting wall portion 152a, and the first central side wall portion 151a of the first magnetic shield portion 150a surround the first flow path portion 110a in a U shape or substantially U shape, collect the first magnetic field (signal magnetic field) generated by the current flowing in the first flow path portion 110a, and guide it to the first magnetic sensor 120a. This makes it possible to strengthen the first magnetic field (signal magnetic field) input to the first magnetic sensor 120a. Therefore, it is possible to further improve the sensitivity to the current to be measured flowing in the conductor 110.

Further, since the first outer side wall portion 153a, the first connecting wall portion 152a, and the first central side wall portion 151a of the first magnetic shield portion 150a collect the first magnetic field (signal magnetic field), it is possible to reduce or prevent the first magnetic field (signal magnetic field) from being emitted to the outside as the disturbance magnetic field.

In addition, in the current sensor 100 of the present preferred embodiment, the second magnetic shield portion 150b also has the same or substantially the same configuration and has the same or substantially the same function as those of the first magnetic shield portion 150a.

Note that in the present preferred embodiment, the dimensions (length, width, thickness, cross-sectional area) of the first flow path portion 110a and the dimensions (length, width, thickness, cross-sectional area) of the second flow path portion 110b may preferably be the same or substantially the same. Thus, the currents of the same magnitude separately flow in the first flow path portion 110a and the second flow path portion 110b, respectively, and the magnetic field applied to the first magnetic sensor 120a disposed in the vicinity of the first flow path portion 110a and the magnetic field applied to the second magnetic sensor 120b disposed in the vicinity of the second flow path portion 110b are equal or substantially equal to each other.

Further, the magnetic field collected to the first central side wall portion 151a of the first magnetic shield portion 150a and the magnetic field collected to the second central side wall portion 151b of the second magnetic shield portion 150b are equal or substantially equal to each other. Thus, in comparison with a case in which the magnetism collection is performed by only one of the first and second central side wall portions 151a and 151b due to the different magnetic permeability, and the one is magnetically saturated before the other, the advantageous effect of reducing or preventing the magnetic saturation at the first central side wall portion 151a and the second central side wall portion 151b is able to be improved, and the advantageous effect of reducing the influence of the disturbance magnetic field is able to be improved.

A current sensor 100 according to a first modification of the first preferred embodiment is different from the current sensor 100 according to the first preferred embodiment in the shapes of the first magnetic shield portion and the second magnetic shield portion.

Figure 9A:
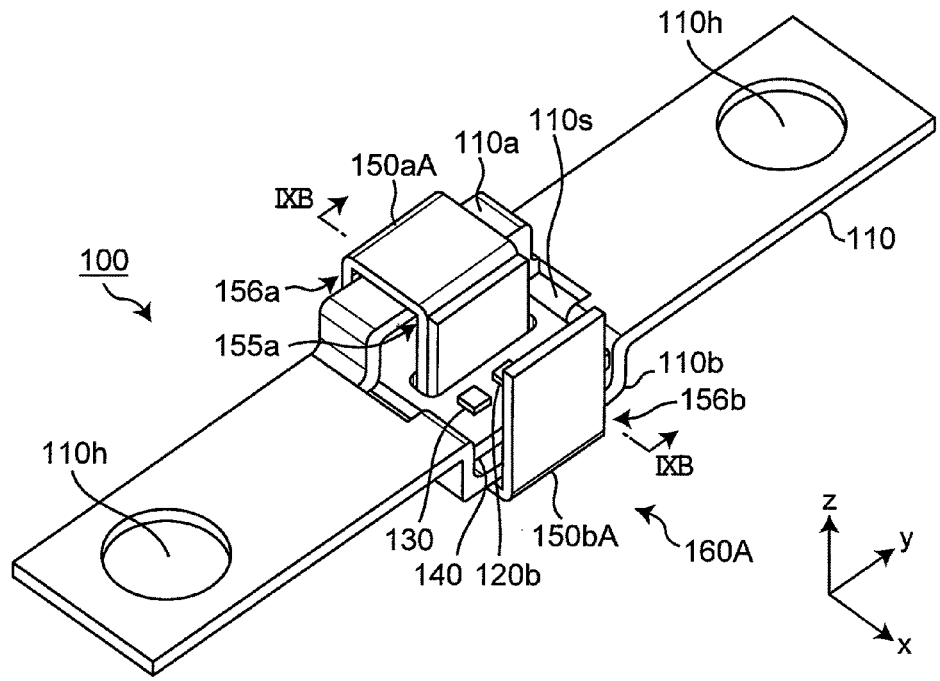
FIG. 9A is a perspective view illustrating an external appearance of a current sensor (a housing is not illustrated) according to a first modification of the first preferred embodiment of the present invention.
Figure 9B:
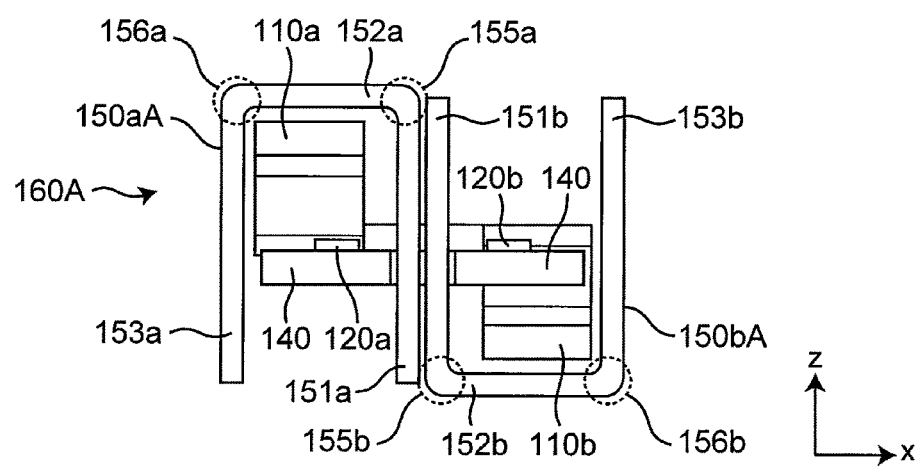
FIG. 9B is a cross-sectional view of the current sensor (the housing is not illustrated) illustrated in FIG. 9A when viewed from a direction of arrows on a line IXB-IXB.

FIG. 9A is a perspective view illustrating an external appearance of the current sensor (a housing is not illustrated) according to the first modification of the first preferred embodiment, and FIG. 9B is a cross-sectional view of the current sensor (the housing is not illustrated) illustrated in FIG. 9A when viewed from a direction of arrows on a line IXB-IXB.

As illustrated in FIGS. 9A and 9B, in a magnetic sensor unit 160A of the current sensor 100 of the first modification, in a first magnetic shield portion 150aA, a portion 155a at which the first central side wall portion 151a and the first connecting wall portion 152a are connected to each other and a portion 156a at which the first connecting wall portion 152a and the first outer side wall portion 153a are connected to each other have an arc shape. Additionally, in a second magnetic shield portion 150bA, a portion 155b at which the second central side wall portion 151b and the second connecting wall portion 152b are connected to each other and a portion 156b at which the second connecting wall portion 152b and the second outer side wall portion 153b are connected to each other have an arc shape.

Here, in space, a trajectory of a magnetic field generated by a current flowing in a conductor is originally a circle or an ellipse. According to the current sensor 100 of the first modification, the trajectory of the magnetic field collected by each of the first magnetic shield portion 150aA and the second magnetic shield portion 150bA is able to be brought close to an original trajectory, and thus, magnetism collection efficiency is able to be improved.

In the first preferred embodiment, the magnetic sensor including the sensitivity axis in a direction horizontal or substantially horizontal to the main surface of the magnetic sensor is provided, but in a second modification of the first preferred embodiment, a magnetic sensor having the sensitivity axis in a direction perpendicular or substantially perpendicular to the main surface of the magnetic sensor is used.

Figure 10A:
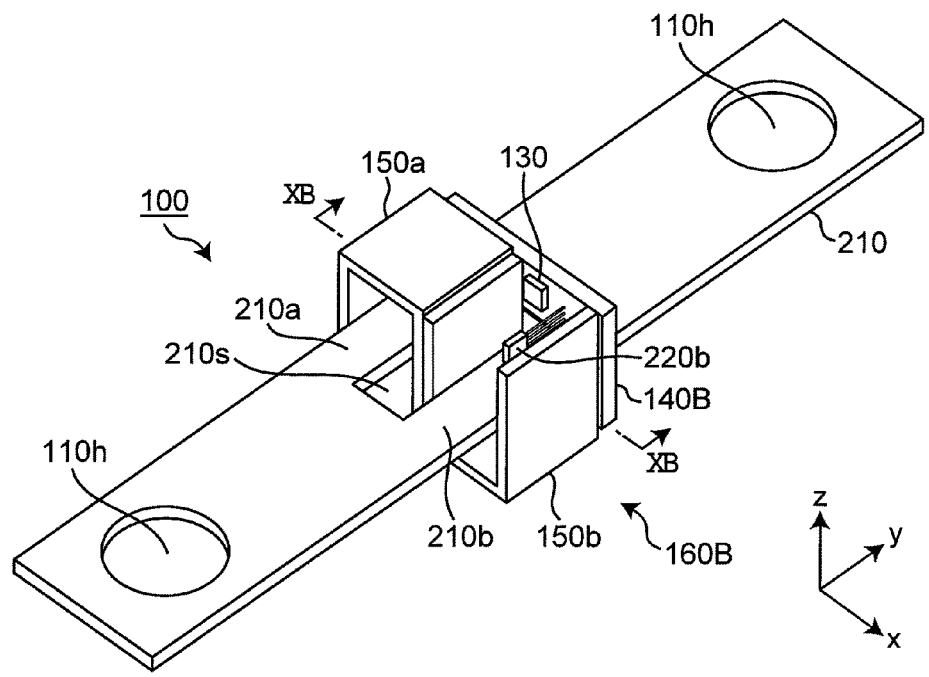
FIG. 10A is a perspective view illustrating an external appearance of a current sensor (a housing is not illustrated) according to a second modification of the first preferred embodiment of the present invention.
Figure 10B:
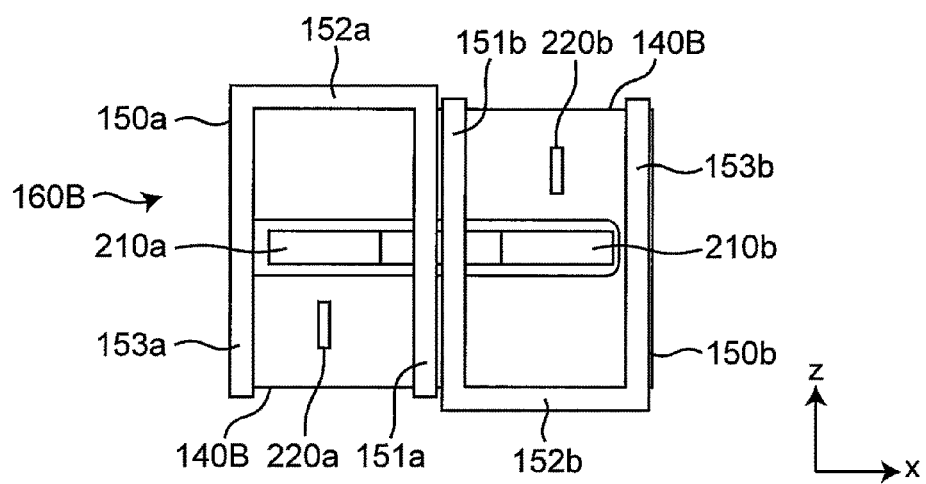
FIG. 10B is a cross-sectional view of the current sensor (the housing is not illustrated) illustrated in FIG. 10A when viewed from a direction of arrows on a line XB-XB.

FIG. 10A is a perspective view illustrating an external appearance of a current sensor (a housing is not illustrated) according to the second modification of the first preferred embodiment, and FIG. 10B is a cross-sectional view of the current sensor (the housing is not illustrated) illustrated in FIG. 10A when viewed from a direction of arrows on a line XB-XB.

As illustrated in FIGS. 10A and 10B, a magnetic sensor unit 160B of the current sensor 100 of the second modification includes a first magnetic sensor 220a and a second magnetic sensor 220b, instead of the first magnetic sensor 120a and the second magnetic sensor 120b, and includes a substrate 140B, instead of the substrate 140.

Each of the first magnetic sensor 220a and the second magnetic sensor 220b is resin-packaged and has a rectangular or substantially rectangular parallelepiped shape including a main surface. The first magnetic sensor 220a and the second magnetic sensor 220b include the sensitivity axes in directions perpendicular or substantially perpendicular to the main surfaces, respectively. In this case, as the first magnetic sensor 220a and the second magnetic sensor 220b, SIP (Single Inline Package) components, for example, are preferably used, and the substrate 140B on which these components are mounted is disposed so as to intersect with the length direction (Y direction) of the conductor 110. As described above, depending on the sensitivity axis of the magnetic sensor, the component shape of the magnetic sensor and arrangement of the substrate that determines the arrangement position of the magnetic sensor may be appropriately changed.

Note that a conductor 210 of the current sensor 100 of the second modification branches into a first flow path portion 210a and a second flow path portion 210b at a portion in the length direction (Y-axis direction). The first flow path portion 210a and the second flow path portion 210b are aligned in the width direction (X-axis direction) of the conductor 110, and a slit 210s is provided between the first flow path portion 210a and the second flow path portion 210b. Each of the first flow path portion 210a and the second flow path portion 110b has a flat shape.

Second Preferred Embodiment

A current sensor according to a second preferred embodiment of the present invention is different from the current sensor 100 according to the first preferred embodiment in the shapes of the first magnetic shield portion and the second magnetic shield portion.

Figure 11A:
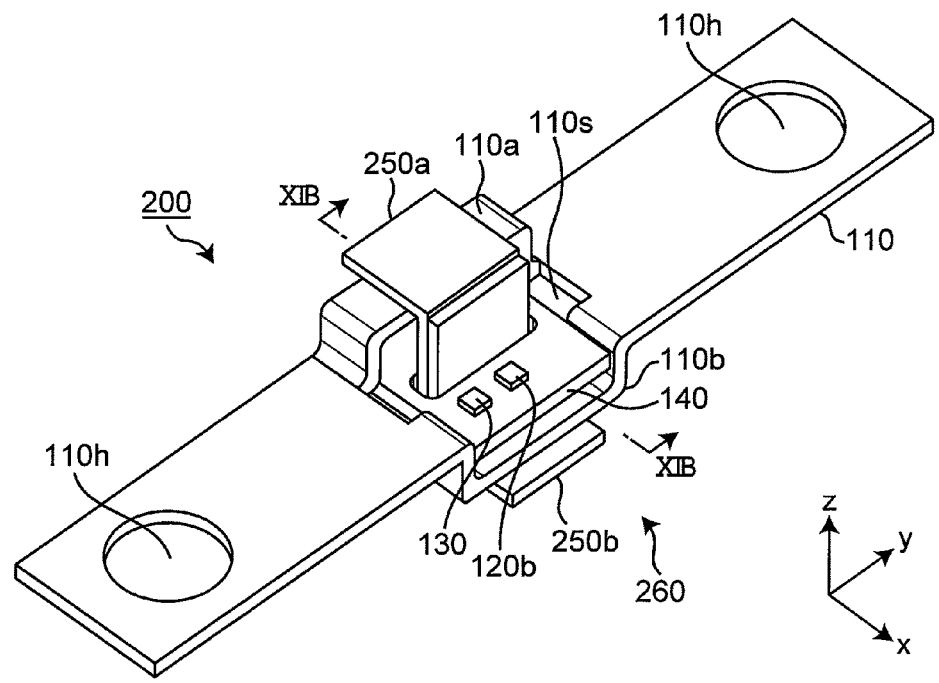
FIG. 11A is a perspective view illustrating an external appearance of a current sensor (a housing is not illustrated) according to a second preferred embodiment of the present invention.
Figure 11B:
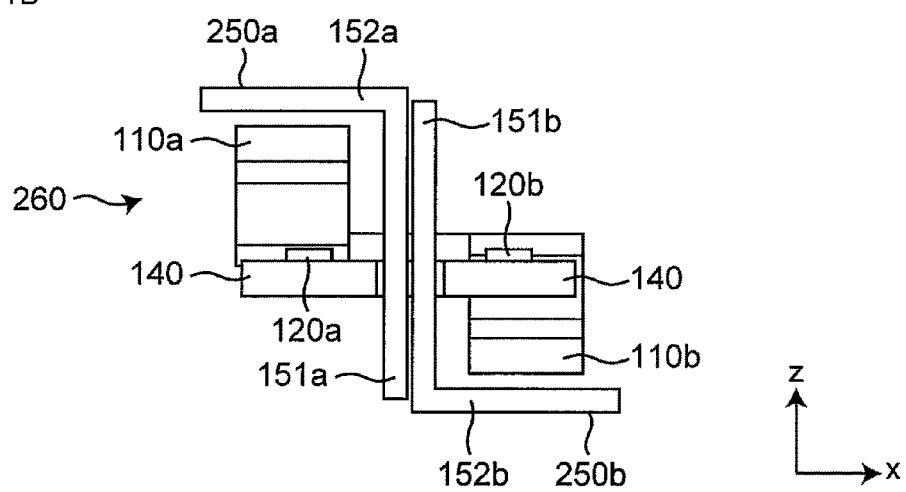
FIG. 11B is a cross-sectional view of the current sensor (the housing is not illustrated) illustrated in FIG. 11A when viewed from a direction of arrows on a line XIB-XIB.

FIG. 11A is a perspective view illustrating an external appearance of the current sensor (a housing is not illustrated) according to the second preferred embodiment, and FIG. 11B is a cross-sectional view of the current sensor (the housing is not illustrated) illustrated in FIG. 11A when viewed from a direction of arrows on a line XIB-XIB.

As illustrated in FIGS. 11A and 11B, a magnetic sensor unit 260 of a current sensor 200 of the second preferred embodiment includes a first magnetic shield portion 250a and a second magnetic shield portion 250b, instead of the first magnetic shield portion 150a and the second magnetic shield portion 150b.

The first magnetic shield portion 250a does not include the first outer side wall portion 153a, and includes only the first central side wall portion 151a and the first connecting wall portion 152a described above. In other words, the first magnetic shield portion 250a has an L-shaped or substantially L-shaped cross section.

The second magnetic shield portion 250b does not include the second outer side wall portion 153b, and includes only the second central side wall portion 151b and the second connecting wall portion 152b described above. In other words, the second magnetic shield portion 250b has an L-shaped or substantially L-shaped cross section.

In this manner, in the current sensor 200 of the present preferred embodiment, the first central side wall portion 151a and the second central side wall portion 151b are disposed in the region between the first flow path portion 110a and the second flow path portion 110b, at which the magnetic saturation of the magnetic body is reduced or prevented. Therefore, it is possible to reduce or prevent the ability to collect the disturbance magnetic field from decreasing due to the magnetic saturation of the first central side wall portion 151a and the second central side wall portion 151b. This makes it possible, in the first magnetic sensor 120a and the second magnetic sensor 120b, to reduce the influence of the disturbance magnetic field in a state in which the magnetic saturation is reduced or prevented.

Additionally, in the current sensor 200 of the present preferred embodiment, the first connecting wall portion 152a and the first central side wall portion 151a of the first magnetic shield portion 150a surround the first flow path portion 110a in an L shape or substantially L shape, collect the first magnetic field (signal magnetic field) generated by the current flowing in the first flow path portion 110a, and guide it to the first magnetic sensor 120a. This makes it possible to strengthen the first magnetic field (signal magnetic field) input to the first magnetic sensor 120a. Therefore, it is possible to further improve the sensitivity to the current to be measured flowing in the conductor 110.

Further, since the first connecting wall portion 152a and the first central side wall portion 151a of the first magnetic shield portion 150a collect the first magnetic field (signal magnetic field), it is possible to reduce or prevent the first magnetic field (signal magnetic field) from being emitted to the outside as the disturbance magnetic field.

In addition, in the current sensor 200 of the present preferred embodiment, the second connecting wall portion 152b and the second central side wall portion 151b of the second magnetic shield portion 150b also have the same or substantially the same functions as those of the first connecting wall portion 152a and the first central side wall portion 151a of the first magnetic shield portion 150a.

The current sensor according to the second preferred embodiment includes two magnetic shield portions of the first magnetic shield portion and the second magnetic shield portion. A current sensor according to a modification of the second preferred embodiment includes one magnetic shield portion.

Figure 12A:
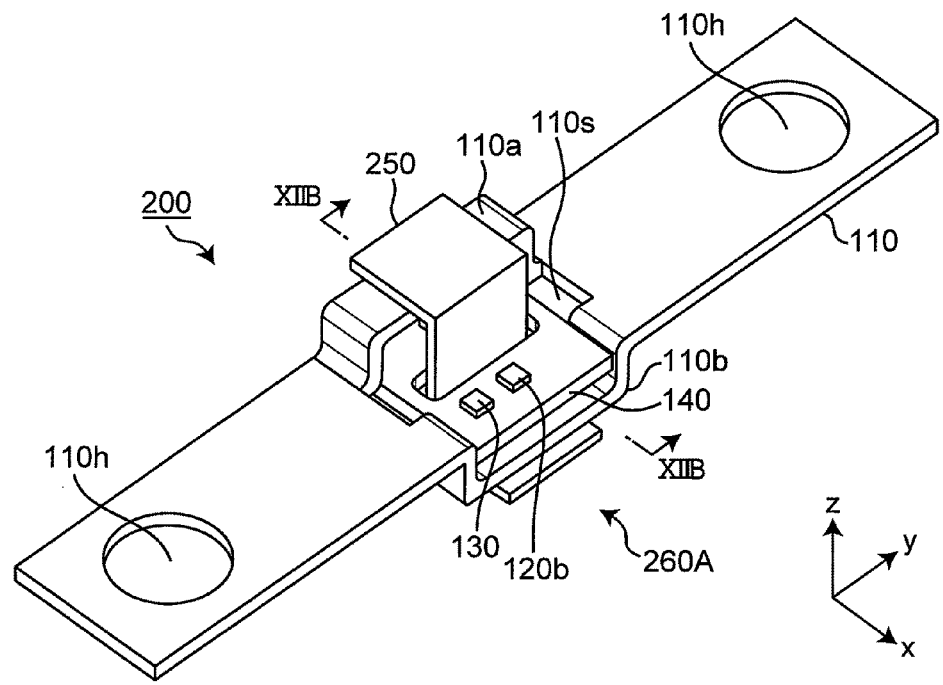
FIG. 12A is a perspective view illustrating an external appearance of a current sensor (a housing is not illustrated) according to a modification of the second preferred embodiment of the present invention.
Figure 12B:
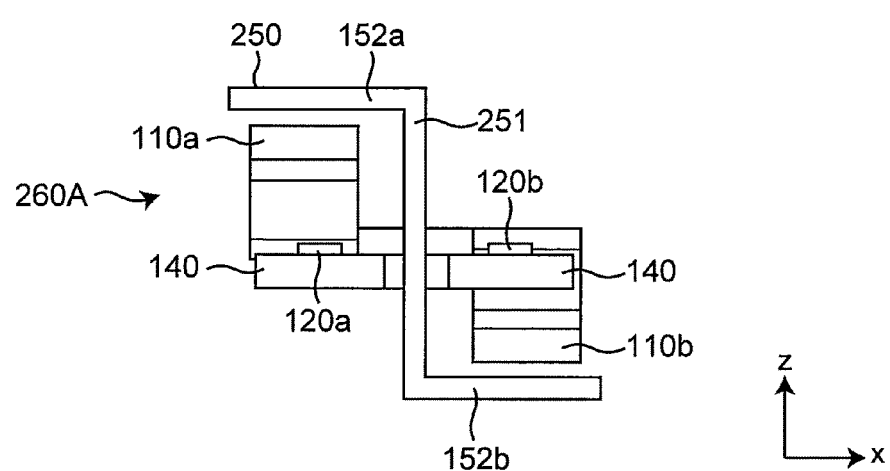
FIG. 12B is a cross-sectional view of the current sensor (the housing is not illustrated) illustrated in FIG. 12A when viewed from a direction of arrows on a line XIIB-XIIB.

FIG. 12A is a perspective view illustrating an external appearance of the current sensor (a housing is not illustrated) according to the modification of the second preferred embodiment, and FIG. 12B is a cross-sectional view of the current sensor (the housing is not illustrated) illustrated in FIG. 12A when viewed from a direction of arrows on a line XIIB-XIIB.

As illustrated in FIGS. 12A and 12B, a magnetic sensor unit 260A of the current sensor 200 of the modification includes a magnetic shield portion 250, instead of the first magnetic shield portion 250a and the second magnetic shield portion 250b.

The magnetic shield portion 250 includes a central side wall portion 251, and the first connecting wall portion 152a and the second connecting wall portion 152b described above. The central side wall portion 251 has a flat plate shape, and couples the first connecting wall portion 152a and the second connecting wall portion 152b. The magnetic shield portion 250 surrounds the first flow path portion 110a and the first magnetic sensor 120a in an L shape or substantially L shape, and is disposed such that the first connecting wall portion 152a is parallel or substantially parallel to the first flow path portion 110a. Additionally, the magnetic shield portion 250 surrounds the second flow path portion 110b and the second magnetic sensor 120b in an L or substantially L shape, and is disposed such that the second connecting wall portion 152b is parallel or substantially parallel to the second flow path portion 110b.

Specifically, the central side wall portion 251 intersects with the main surface of the conductor 110, and through the slit 110s between the first flow path portion 110a and the second flow path portion 110b. Further, a central side wall portion 251a is disposed between the first magnetic sensor 120a and the second magnetic sensor 120b.

As described above, in the current sensor 200 of the present modification, in the magnetic shield portion 250, the first connecting wall portion 152a, the central side wall portion 251, and the second connecting wall portion 152b are integrally connected. In the current sensor 200 of the present modification, the central side wall portion 251 is disposed in the region between the first flow path portion 110a and the second flow path portion 110b, at which the magnetic saturation of the magnetic body is reduced or prevented. Therefore, it is possible to reduce or prevent the ability to collect the disturbance magnetic field from decreasing due to the magnetic saturation of the central side wall portion 251. This makes it possible, in the first magnetic sensor 120a and the second magnetic sensor 120b, to reduce or prevent the influence of the disturbance magnetic field in a state in which the magnetic saturation is reduced or prevented.

Third Preferred Embodiment

A current sensor according to a third preferred embodiment of the present invention is different from the current sensor 200 according to the modification of the second preferred embodiment in the shape of the magnetic shield portion.

Figure 13A:
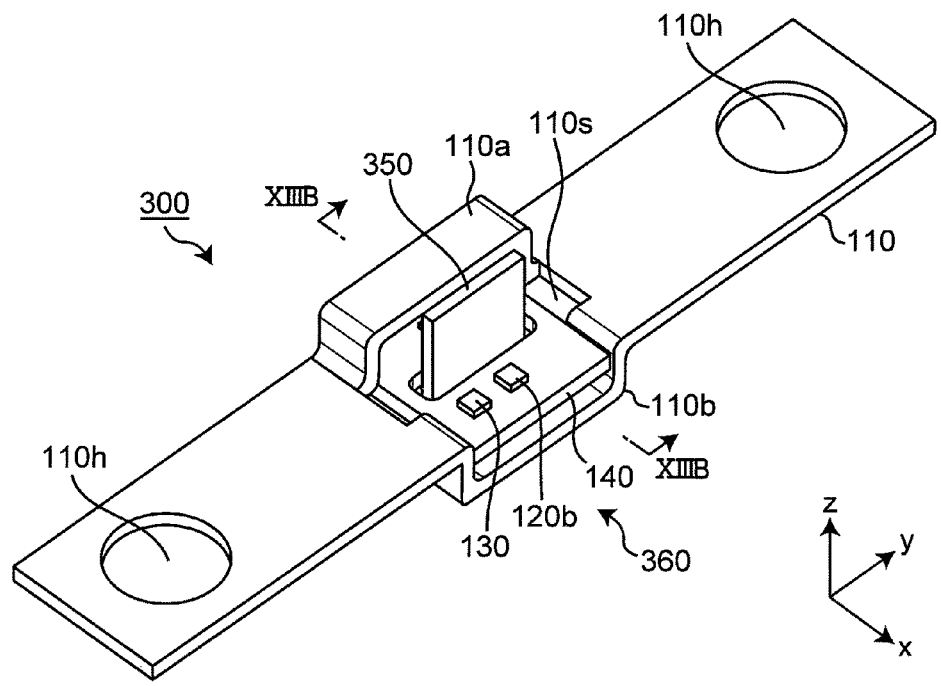
FIG. 13A is a perspective view illustrating an external appearance of a current sensor (a housing is not illustrated) according to a third preferred embodiment of the present invention.
Figure 13B:
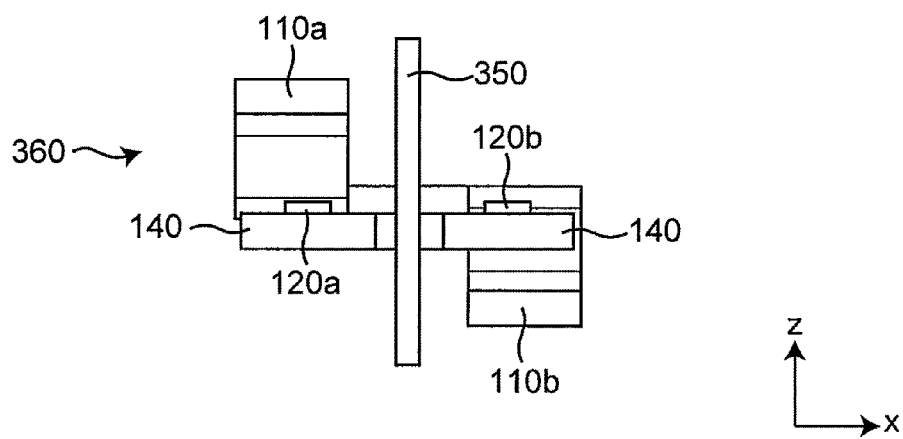
FIG. 13B is a cross-sectional view of the current sensor (the housing is not illustrated) illustrated in FIG. 13A when viewed from a direction of arrows on a line XIIIB-XIIIB.

FIG. 13A is a perspective view illustrating an external appearance of the current sensor (a housing is not illustrated) according to the third preferred embodiment, and FIG. 13B is a cross-sectional view of the current sensor (the housing is not illustrated) illustrated in FIG. 13A when viewed from a direction of arrows on a line XIIIB-XIIIB.

As illustrated in FIGS. 12A and 12B, a magnetic sensor unit 360 of a current sensor 300 of the third preferred embodiment includes a magnetic shield portion 350, instead of the magnetic shield portion 250.

The magnetic shield portion 350 does not include the first connecting wall portion 152a and the second connecting wall portion 152b, and includes only a portion corresponding to the central side wall portion 251 described above. In other words, the magnetic shield portion 350 has an I-shaped or substantially I-shaped cross section.

As described above, in the current sensor 300 of the present preferred embodiment, the magnetic shield portion 350 includes a single member made of a magnetic body material. In the current sensor 300 of the present preferred embodiment, the magnetic shield portion 350 is disposed in the region between the first flow path portion 110a and the second flow path portion 110b, at which the magnetic saturation of the magnetic body is reduced or prevented. Therefore, it is possible to reduce or prevent the ability to collect the disturbance magnetic field from decreasing due to the magnetic saturation of the magnetic shield portion 350. This makes it possible, in the first magnetic sensor 120a and the second magnetic sensor 120b, to reduce the influence of the disturbance magnetic field in a state in which the magnetic saturation is reduced or prevented.

Fourth Preferred Embodiment

A current sensor according to a fourth preferred embodiment of the present invention is different from the current sensor 100 according to the first preferred embodiment in the arrangement positions of the first magnetic shield portion and the second magnetic shield portion. Additionally, the direction of the sensitivity axis of the magnetic sensor in the current sensor is also different from that in the first preferred embodiment.

Figure 14A:
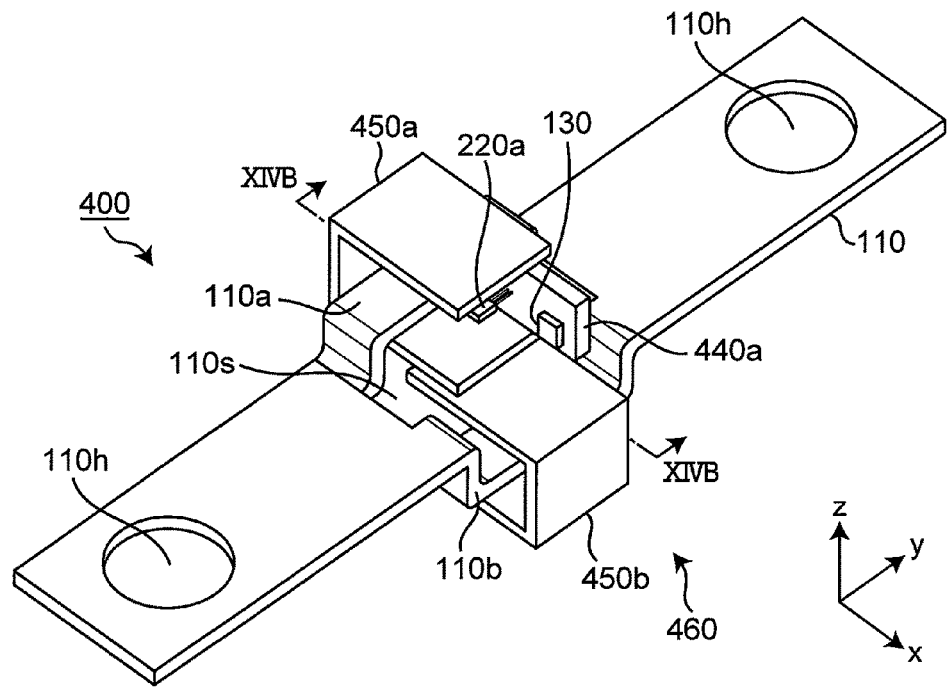
FIG. 14A is a perspective view illustrating an external appearance of a current sensor (a housing is not illustrated) according to a fourth preferred embodiment of the present invention.
Figure 14B:
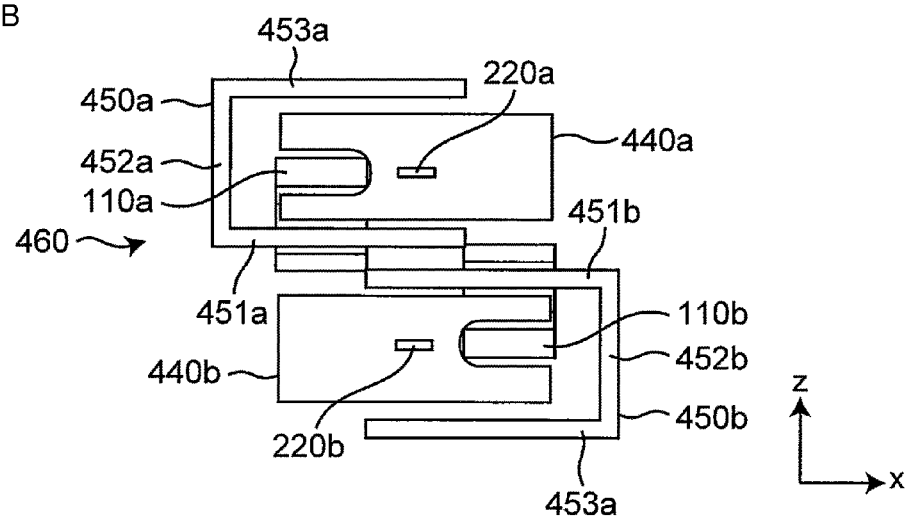
FIG. 14B is a cross-sectional view of the current sensor (the housing is not illustrated) illustrated in FIG. 14A when viewed from a direction of arrows on a line XIVB-XIVB.

FIG. 14A is a perspective view illustrating an external appearance of the current sensor (a housing is not illustrated) according to the fourth preferred embodiment, and FIG. 14B is a cross-sectional view of the current sensor (the housing is not illustrated) illustrated in FIG. 14A when viewed from a direction of arrows on a line XIVB-XIVB.

As illustrated in FIGS. 14A and 14B, a magnetic sensor unit 460 of a current sensor 400 of the fourth preferred embodiment includes substrates 440a and 440b on which the first magnetic sensor 220a, the second magnetic sensor 220b, and electronic components, such as the amplifying portion 130 described above are provided, respectively, and a first magnetic shield portion 450a and a second magnetic shield portion 450b.

As described above, the first magnetic sensor 220a and the second magnetic sensor 220b each have an SIP (Single Inline Package) component shape, and these components are mounted on the two substrates 440a and 440b, respectively.

The substrates 440a and 440b intersect with the length direction (Y direction) of the conductor 110.

In the present preferred embodiment, the first and second magnetic sensors 220a and 220b are disposed on the substrates 440a and 440b, respectively, such that the directions of the respective sensitivity axes are parallel or substantially parallel to the Z-axis direction (the thickness direction of the conductor 110) within an allowable error range as appropriate.

The first magnetic shield portion 450a includes a first central side wall portion 451a, a first connecting wall portion 452a, and a first outer side wall portion 453a. Each of the first central side wall portion 451a, the first connecting wall portion 452a, and the first outer side wall portion 453a preferably has a flat plate shape. The first central side wall portion 451a and the first outer side wall portion 453a face each other. The first connecting wall portion 452a is connected to the first central side wall portion 451a, and is also connected to the first outer side wall portion 453a. In other words, the first central side wall portion 451a and the first outer side wall portion 453a are coupled to each other with the first connecting wall portion 452a. Thus, the first magnetic shield portion 450a has a U-shaped or substantially U-shaped cross section.

The first magnetic shield portion 450a surrounds the first flow path portion 110a and the first magnetic sensor 220a in a U shape or substantially U shape, and is disposed such that the first central side wall portion 451a and the first outer side wall portion 453a is parallel or substantially parallel to the first flow path portion 110a.

Specifically, the first central side wall portion 451a is parallel or substantially parallel to the main surface of the conductor 110, and between the first flow path portion 110a and the second flow path portion 110b and between the first magnetic sensor 220a and the second magnetic sensor 220b. The first outer side wall portion 453a is parallel or substantially parallel to the main surface of the conductor 110 and faces the first central side wall portion 451a with the first flow path portion 110a and the first magnetic sensor 220a interposed therebetween. The first connecting wall portion 452a intersects with the main surface of the conductor 110 and faces the first magnetic sensor 220a with the first flow path portion 110a interposed therebetween.

In the same or similar manner, the second magnetic shield portion 450b includes a second central side wall portion 451b, a second connecting wall portion 452b, and a second outer side wall portion 453b. Each of the second central side wall portion 451b, the second connecting wall portion 452b, and the second outer side wall portion 453b preferably has a flat plate shape. The second central side wall portion 451b and the second outer side wall portion 453b face each other. The second connecting wall portion 452b is connected to the second central side wall portion 451b, and is also connected to the second outer side wall portion 453b. In other words, the second central side wall portion 451b and the second outer side wall portion 453b are coupled to each other with the second connecting wall portion 452b. Thus, the second magnetic shield portion 450b has a U-shaped or substantially U-shaped cross section.

The second magnetic shield portion 450b surrounds the second flow path portion 110b and the second magnetic sensor 220b in a U shape or substantially U shape, and is disposed such that the second central side wall portion 451b and the second outer side wall portion 453b is parallel or substantially parallel to the second flow path portion 110b.

Specifically, the second central side wall portion 451b is parallel or substantially parallel to the main surface of the conductor 110, and between the first flow path portion 110a and the second flow path portion 110b and between the first magnetic sensor 220a and the second magnetic sensor 220b.

The second outer side wall portion 453b is parallel or substantially parallel to the main surface of the conductor 110 and faces the second central side wall portion 451b with the second flow path portion 110b and the second magnetic sensor 220b interposed therebetween. The second connecting wall portion 452b intersects with the main surface of the conductor 110 and faces the second magnetic sensor 220b with the second flow path portion 110b interposed therebetween.

Note that a second central side wall portion 251b of the second magnetic shield portion 450b may be disposed on a side of the second flow path portion 110b and the second magnetic sensor 220b farther than the first central side wall portion 451a of the first magnetic shield portion 450a, or may be arranged on a side of the first flow path portion 110a and the first magnetic sensor 220a farther than the first central side wall portion 451a.

In the present preferred embodiment, in order to verify the advantageous effects of the magnetic shield portion, the inventor of preferred embodiments of the present invention has performed the same magnetic field analysis as in the first preferred embodiment.

Figure 15A:
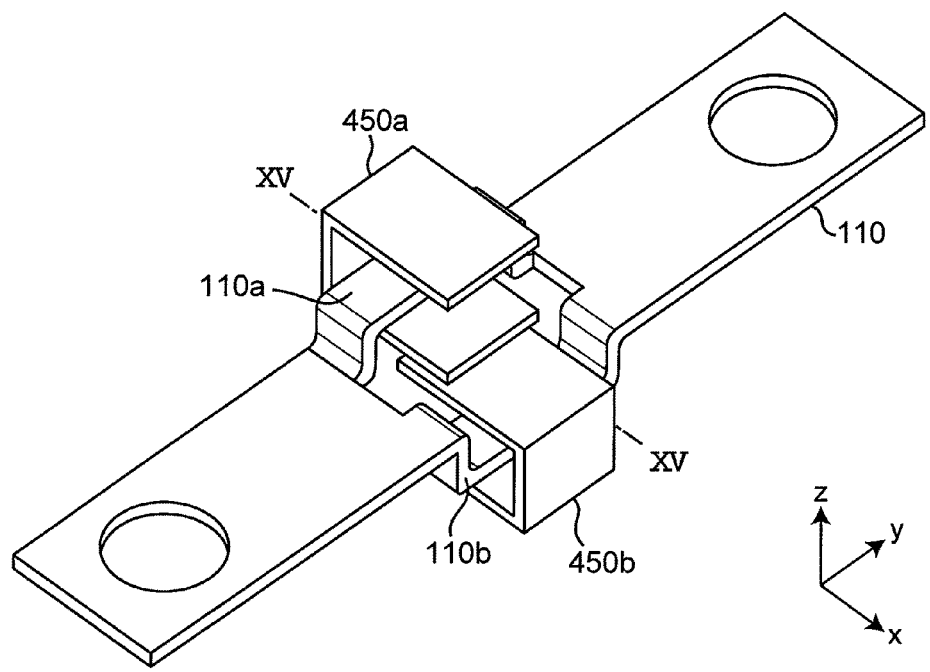
FIG. 15A is a diagram illustrating a configuration in which a first magnetic shield portion and a second magnetic shield portion of the fourth preferred embodiment of the present invention are further disposed on the conductor illustrated in FIG. 3.

FIG. 15A is a diagram illustrating a configuration in which the first magnetic shield portion 450a and the second magnetic shield portion 450b of the present preferred embodiment are further disposed on the conductor 110 illustrated in FIG. 3. As a material of the first magnetic shield portion 450a and the second magnetic shield portion 450b, silicon steel, for example, is preferably used, and the thicknesses thereof are each set to about 1.0 mm, for example.

Figure 15B:
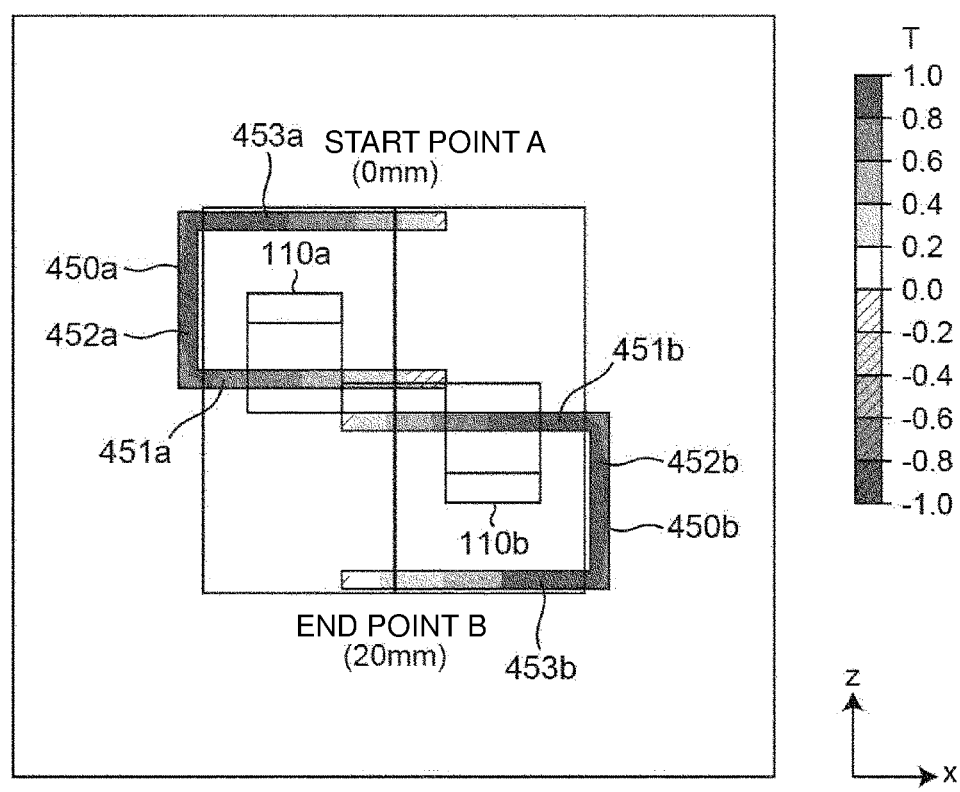
FIG. 15B shows a result of magnetic field analysis when a current is supplied to the conductor in the configuration illustrated in FIG. 15A, and is a contour diagram of magnetic flux density intensity only of the first magnetic shield portion and the second magnetic shield portion on the ZX plane including a line XV-XV.
Figure 15C:
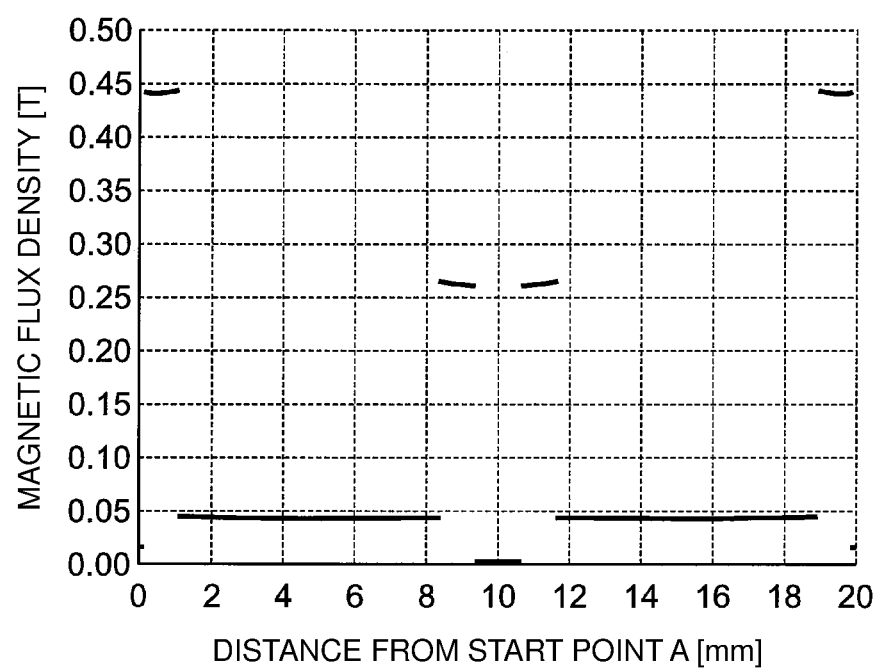
FIG. 15C is a graph showing magnitude of a magnetic flux density along a line A-B in FIG. 15B.
Figure 15D:
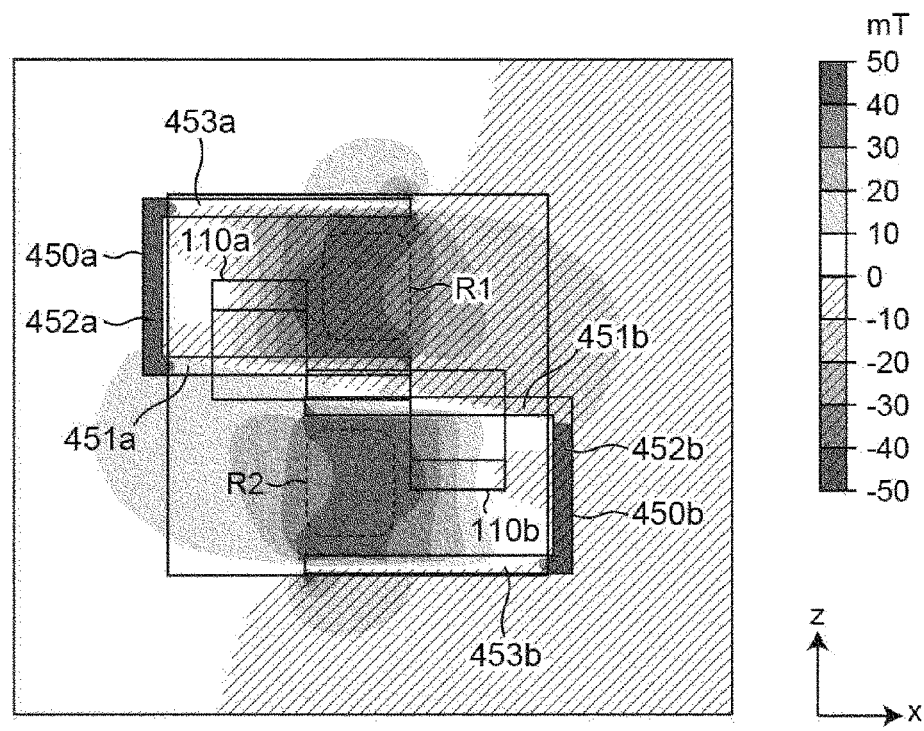
FIG. 15D shows a result of magnetic field analysis when a current is supplied to the conductor in the configuration illustrated in FIG. 15A, and is a contour diagram of magnetic flux density intensity in the X direction on the ZX plane including the line XV-XV.

FIG. 15B shows a result of the magnetic field analysis when a current is supplied to the conductor 110 in the configuration illustrated in FIG. 15A, and is a contour diagram of the magnetic flux density intensity only of the first magnetic shield portion 450a and the second magnetic shield portion 450b in the Z direction (that is, the sensitivity axis direction) on the ZX plane including a line XV-XV. FIG. 15C is a graph showing magnitude of the magnetic flux density along a line A-B in FIG. 15B. FIG. 15D shows a result of the magnetic field analysis when a current is supplied to the conductor 110 in the configuration illustrated in FIG. 15A, and is a contour diagram of the magnetic flux density intensity in the X direction on the ZX plane including the line XV-XV. In this magnetic field analysis as well, a current of 500 A was flowed in the conductor 110.

In the magnetic field analysis, as described below, results similar to those in the magnetic field analysis in the first preferred embodiment were obtained.

According to the analysis results in FIGS. 15B and 15C, it was discovered that, in the first magnetic shield portion 450a, the magnetic flux in the first central side wall portion 451a is smaller than the magnetic flux in each of the first connecting wall portion 452a and the first outer side wall portion 453a. Additionally, it was discovered that, in the second magnetic shield portion 450b, the magnetic flux in the second central side wall portion 451b is smaller than the magnetic flux in each of the second connecting wall portion 452b and the second outer side wall portion 453b.

In the current sensor 400 of the present preferred embodiment, the first central side wall portion 451a and the second central side wall portion 451b are disposed in the region between the first flow path portion 110a and the second flow path portion 110b, at which the magnetic saturation of the magnetic body is reduced or prevented. Therefore, it is possible to reduce or prevent the ability to collect the disturbance magnetic field from decreasing due to the magnetic saturation of the first central side wall portion 451a and the second central side wall portion 451b. This makes it possible, in the first magnetic sensor 220a and the second magnetic sensor 220b, to reduce the influence of the disturbance magnetic field in a state in which the magnetic saturation is reduced or prevented.

Next, according to the analysis result in FIG. 15D, it was discovered that the magnetic flux density intensity of the signal magnetic field in a region R1 surrounded by the first magnetic shield portion 450a and a region R2 surrounded by the second magnetic shield portion 450b is strong.

As described above, in the current sensor 400 of the present preferred embodiment, the first outer side wall portion 453a, the first connecting wall portion 452a, and the first central side wall portion 451a of the first magnetic shield portion 450a surround the first flow path portion 110a in a U shape or substantially U shape, collect the first magnetic field (signal magnetic field) generated by the current flowing in the first flow path portion 110a, and guide it to the first magnetic sensor 220a. This makes it possible to strengthen the first magnetic field (signal magnetic field) input to the first magnetic sensor 220a. The same applies to the signal magnetic field in the region surrounded by the second magnetic shield portion 450b. Therefore, it is possible to further improve the sensitivity to the current to be measured flowing in the conductor 110.

Additionally, according to the analysis result in FIG. 15D, it was discovered that the magnetic flux density intensity of the signal magnetic field in the outer side portion of the first magnetic shield portion 450a and the second magnetic shield portion 450b decreases.

As described above, in the current sensor 400 of the present preferred embodiment, since the first outer side wall portion 453a, the first connecting wall portion 452a, and the first central side wall portion 451a of the first magnetic shield portion 450a collect the first magnetic field (signal magnetic field), it is possible to reduce or prevent the first magnetic field (signal magnetic field) from being emitted to the outside as the disturbance magnetic field. Further, since the second outer side wall portion 453b, the second connecting wall portion 452b, and the second central side wall portion 451b of the second magnetic shield portion 450b collect the second magnetic field (signal magnetic field), it is possible to reduce or prevent the second magnetic field (signal magnetic field) from being emitted to the outside as the disturbance magnetic field.

Fifth Preferred Embodiment

A current sensor according to a fifth preferred embodiment of the present invention is different from the current sensor 400 according to the fourth preferred embodiment in the shapes of the first magnetic shield portion and the second magnetic shield portion.

Figure 16A:
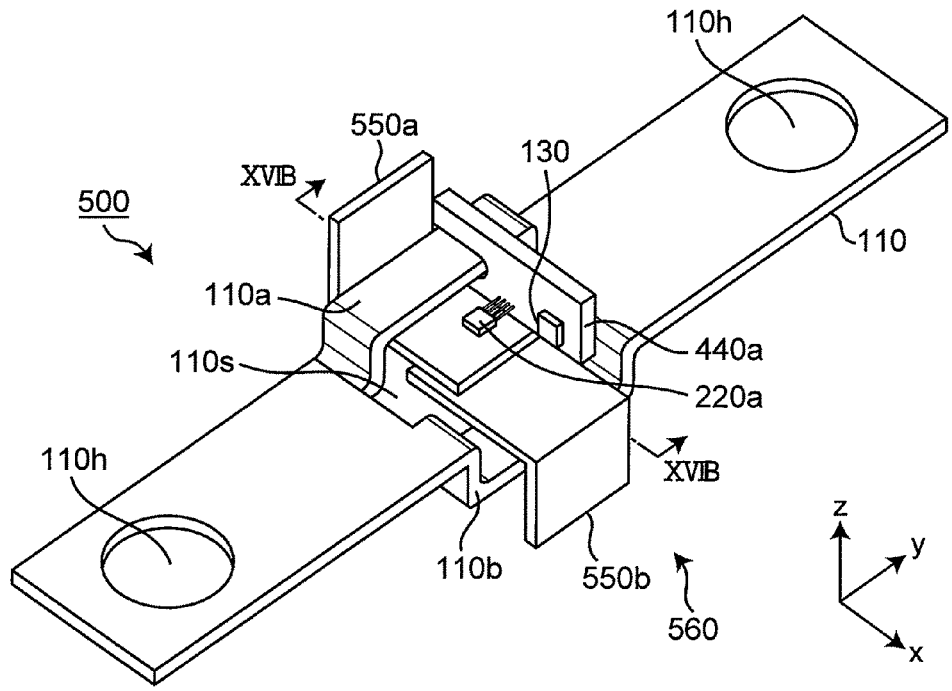
FIG. 16A is a perspective view illustrating an external appearance of a current sensor (a housing is not illustrated) according to a fifth preferred embodiment of the present invention.
Figure 16B:
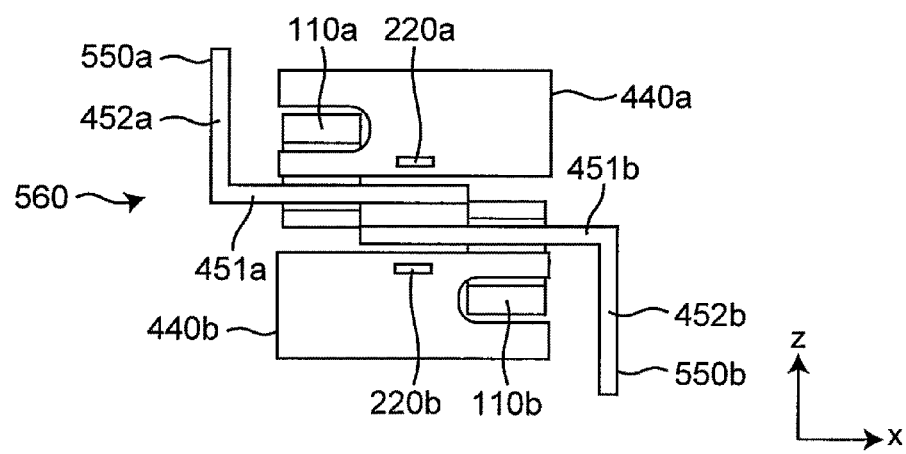
FIG. 16B is a cross-sectional view of the current sensor (the housing is not illustrated) illustrated in FIG. 16A when viewed from a direction of arrows on a line XVIB-XVIB.

FIG. 16A is a perspective view illustrating an external appearance of the current sensor (a housing is not illustrated) according to the fifth preferred embodiment, and FIG. 16B is a cross-sectional view of the current sensor (the housing is not illustrated) illustrated in FIG. 16A when viewed from a direction of arrows on a line XVIB-XVIB.

As illustrated in FIGS. 16A and 16B, a magnetic sensor unit 560 of a current sensor 500 of the fifth preferred embodiment includes a first magnetic shield portion 550a and a second magnetic shield portion 550b, instead of the first magnetic shield portion 450a and the second magnetic shield portion 450b.

The first magnetic shield portion 550a does not include the first outer side wall portion 453a, and includes only the first central side wall portion 451a and the first connecting wall portion 452a described above. In other words, the first magnetic shield portion 550a has an L-shaped or substantially L-shaped cross section.

The second magnetic shield portion 550b does not include the second outer side wall portion 453b, and includes only the second central side wall portion 451b and the second connecting wall portion 452b described above. In other words, the second magnetic shield portion 550b has an L-shaped or substantially L-shaped cross section.

In this manner, in the current sensor 500 of the present preferred embodiment, the first central side wall portion 451a and the second central side wall portion 451b are disposed in the region between the first flow path portion 110a and the second flow path portion 110b, at which the magnetic saturation of the magnetic body is reduced or prevented. Therefore, it is possible to reduce or prevent the ability to collect the disturbance magnetic field from decreasing due to the magnetic saturation of the first central side wall portion 451a and the second central side wall portion 451b. This makes it possible, in the first magnetic sensor 220a and the second magnetic sensor 220b, to reduce the influence of the disturbance magnetic field in a state in which the magnetic saturation is reduced or prevented.

Additionally, in the current sensor 500 of the present preferred embodiment, the first connecting wall portion 452a and the first central side wall portion 451a of the first magnetic shield portion 550a surround the first flow path portion 110a in an L shape or substantially L shape, collect the first magnetic field (signal magnetic field) generated by the current flowing in the first flow path portion 110a, and guide it to the first magnetic sensor 220a. This makes it possible to strengthen the first magnetic field (signal magnetic field) input to the first magnetic sensor 220a. Therefore, it is possible to further improve the sensitivity to the current to be measured flowing in the conductor 110.

Further, since the first connecting wall portion 452a and the first central side wall portion 451a of the first magnetic shield portion 550a collect the first magnetic field (signal magnetic field), it is possible to reduce or prevent the first magnetic field (signal magnetic field) from being emitted to the outside as the disturbance magnetic field.

In addition, in the current sensor 500 of the present preferred embodiment, the second connecting wall portion 452b and the second central side wall portion 451b of the second magnetic shield portion 550b also have the same or substantially the same functions as those of the first connecting wall portion 452a and the first central side wall portion 451a of the first magnetic shield portion 550a.

The current sensor according to the fifth preferred embodiment includes two magnetic shield portions including the first magnetic shield portion and the second magnetic shield portion. A current sensor according to a modification of the fifth preferred embodiment includes one magnetic shield portion.

Figure 17A:
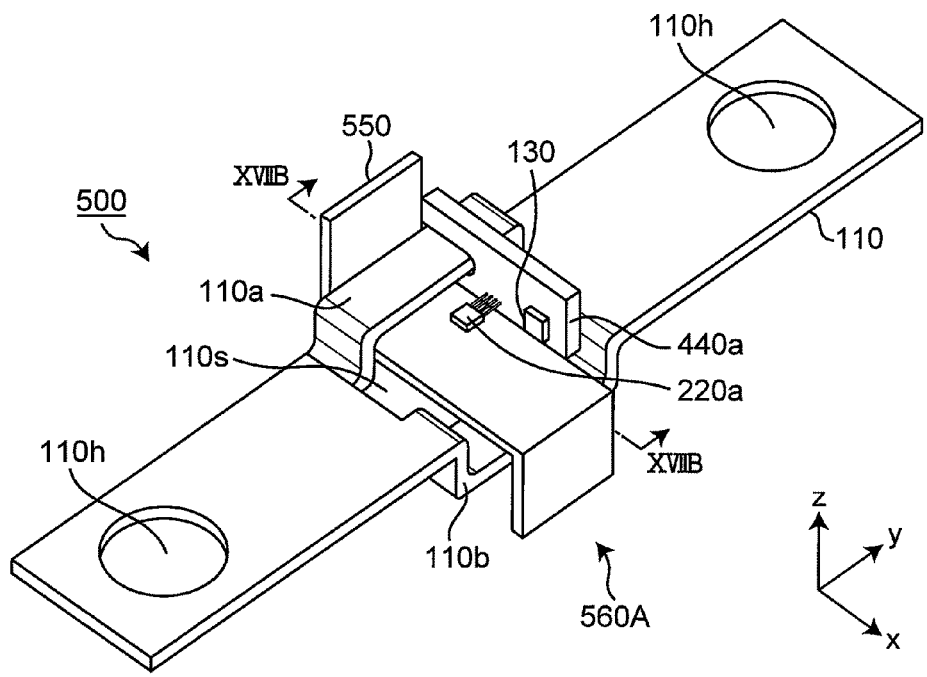
FIG. 17A is a perspective view illustrating an external appearance of a current sensor (a housing is not illustrated) according to a modification of the fifth preferred embodiment of the present invention.
Figure 17B:
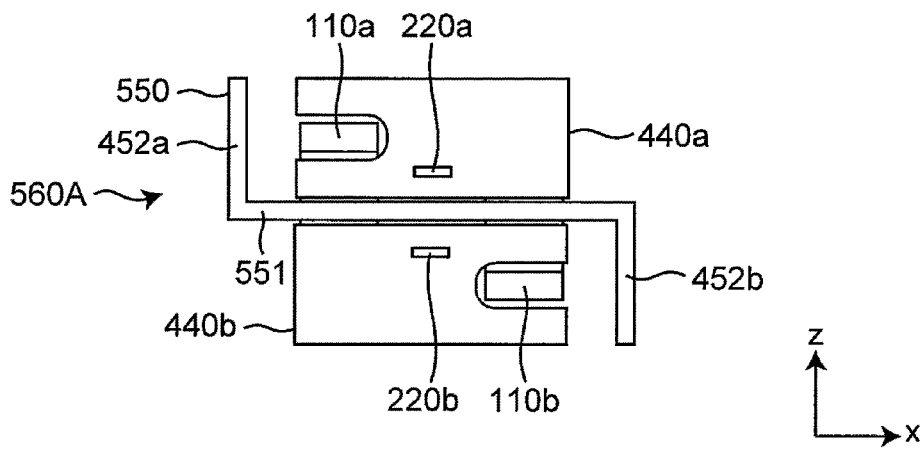
FIG. 17B is a cross-sectional view of the current sensor (the housing is not illustrated) illustrated in FIG. 17A when viewed from a direction of arrows on a line XVIIB-XVIIB.

FIG. 17A is a perspective view illustrating an external appearance of the current sensor (a housing is not illustrated) according to the modification of the fifth preferred embodiment, and FIG. 17B is a cross-sectional view of the current sensor (the housing is not illustrated) illustrated in FIG. 17A when viewed from a direction of arrows on a line XVIIB-XVIIB.

As illustrated in FIGS. 17A and 17B, a magnetic sensor unit 560A of the current sensor 500 of the modification includes a magnetic shield portion 550, instead of the first magnetic shield portion 550a and the second magnetic shield portion 550b.

The magnetic shield portion 550 includes a central side wall portion 551, and the first connecting wall portion 452a and the second connecting wall portion 452b described above. The central side wall portion 551 has a flat plate shape, and couples the first connecting wall portion 452a and the second connecting wall portion 452b. The magnetic shield portion 550 surrounds the first flow path portion 110a and the first magnetic sensor 220a in an L shape or substantially L shape, and is disposed such that the central side wall portion 551 is parallel or substantially parallel to the first flow path portion 110a. Additionally, the magnetic shield portion 550 surrounds the second flow path portion 110b and the second magnetic sensor 220b in an L shape or substantially L shape, and is disposed such that the central side wall portion 551 is parallel or substantially parallel to the second flow path portion 110b.

Specifically, the central side wall portion 551 is parallel or substantially parallel to the main surface of the conductor 110, and between the first flow path portion 110a and the second flow path portion 110b and between the first magnetic sensor 220a and the second magnetic sensor 220b.

As described above, in the current sensor 500 of the present modification, the central side wall portion 551 is disposed in the region between the first flow path portion 110a and the second flow path portion 110b, at which the magnetic saturation of the magnetic body is reduced or prevented. Therefore, it is possible to reduce or prevent the ability to collect the disturbance magnetic field from decreasing due to the magnetic saturation of the central side wall portion 251. This makes it possible, in the first magnetic sensor 220a and the second magnetic sensor 220b, to reduce the influence of the disturbance magnetic field in a state in which the magnetic saturation is reduced or prevented.

Sixth Preferred Embodiment

A current sensor according to a sixth preferred embodiment of the present invention is different from the current sensor 500 according to the modification of the fifth preferred embodiment in the shape of the magnetic shield portion.

Figure 18A:
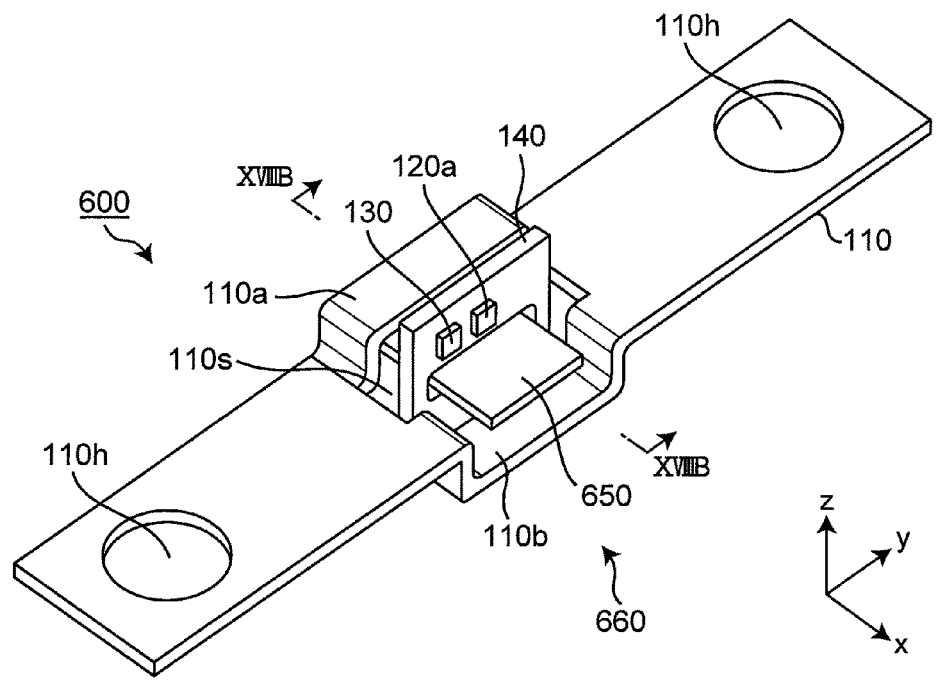
FIG. 18A is a perspective view illustrating an external appearance of a current sensor (a housing is not illustrated) according to a sixth preferred embodiment of the present invention.
Figure 18B:
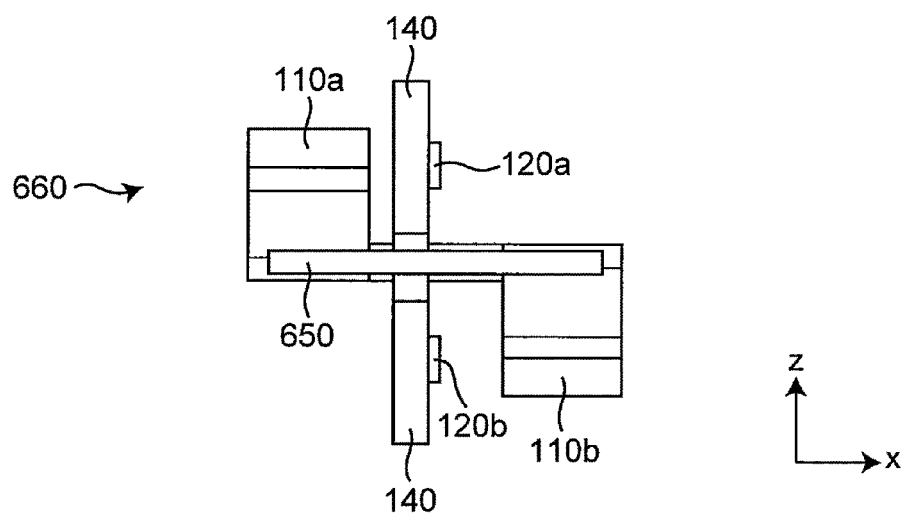
FIG. 18B is a cross-sectional view of the current sensor (the housing is not illustrated) illustrated in FIG. 18A when viewed from a direction of arrows on a line XVIIIB-XVIIIB.

FIG. 18A is a perspective view illustrating an external appearance of the current sensor (a housing is not illustrated) according to the sixth preferred embodiment, and FIG. 18B is a cross-sectional view of the current sensor (the housing is not illustrated) illustrated in FIG. 18A when viewed from a direction of arrows on a line XVIIIB-XVIIIB.

As illustrated in FIGS. 18A and 18B, a magnetic sensor unit 660 of a current sensor 600 of the sixth preferred embodiment includes a magnetic shield portion 650, instead of the magnetic shield portion 550. Additionally, instead of the substrates 440a and 440b on which the first magnetic sensor 220a, the second magnetic sensor 220b, and electronic components, such as the amplifying portion 130, for example, are installed, respectively, the magnetic sensor unit 660 includes the substrate 140 on which the first magnetic sensor 120a, the second magnetic sensor 120b, and electronic components, such as the amplifying portion 130 described above, are installed.

The magnetic shield portion 650 does not include the first connecting wall portion 452a and the second connecting wall portion 452b, and includes only a portion corresponding to the central side wall portion 551 described above. In other words, the magnetic shield portion 650 has an I-shaped or substantially I-shaped cross section.

With this, in the current sensor 600 of the present preferred embodiment, the magnetic shield portion 650 is disposed in the region between the first flow path portion 110a and the second flow path portion 110b, at which the magnetic saturation of the magnetic body is reduced or prevented. Therefore, it is possible to reduce or prevent the ability to collect the disturbance magnetic field from decreasing due to the magnetic saturation of the magnetic shield portion 650. This makes it possible, in the first magnetic sensor 120a and the second magnetic sensor 120b, to reduce the influence of the disturbance magnetic field in a state in which the magnetic saturation is reduced or prevented.

Seventh Preferred Embodiment

The current sensor of each of the first to sixth preferred embodiments described above is suitably applied to an application, such as an on-vehicle inverter, for measuring a three-phase AC current, for example. In the present preferred embodiment, an example in which the current sensor 100 of the first preferred embodiment is applied to the application for measuring the three-phase AC current will be described.

Figure 19A:
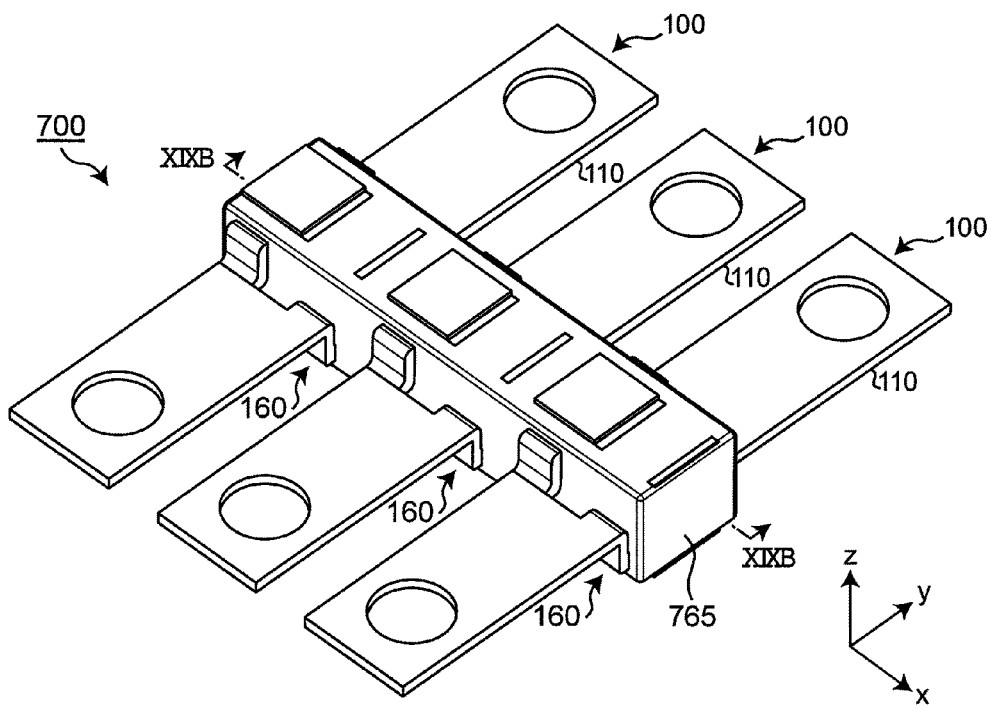
FIG. 19A is a perspective view illustrating an external appearance of a current sensor unit for measuring a three-phase AC current according to a seventh preferred embodiment of the present invention.
Figure 19B:
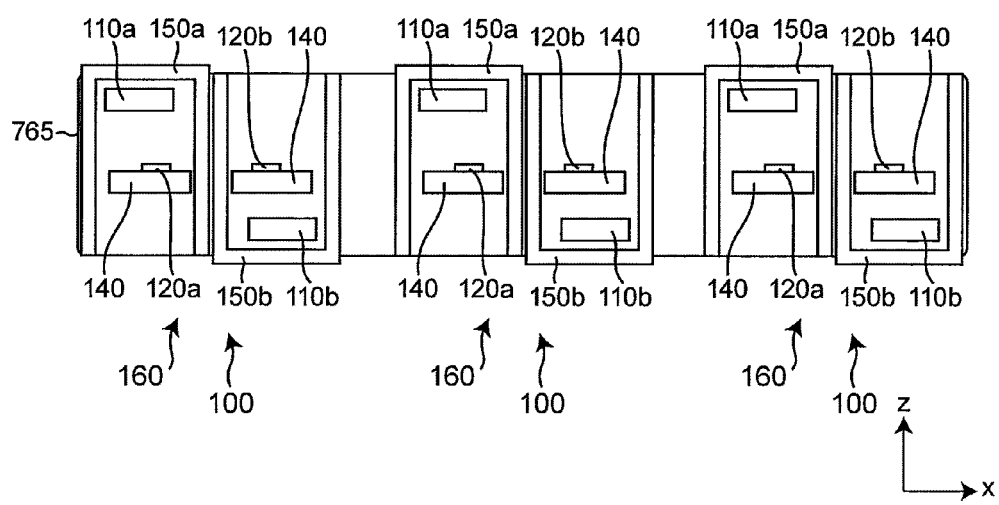
FIG. 19B is a cross-sectional view of the current sensor unit illustrated in FIG. 19A when viewed from a direction of arrows on a line XIXB-XIXB.
Figure 20A:
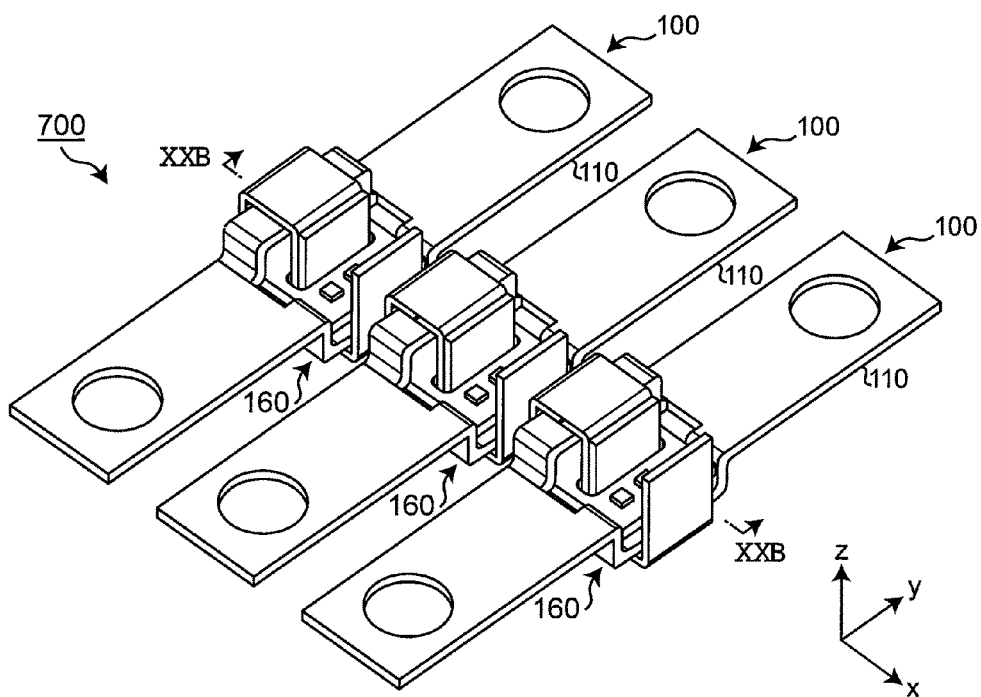
FIG. 20A is a perspective view illustrating an external appearance of the current sensor unit (a housing is not illustrated) according to the seventh preferred embodiment of the present invention.
Figure 20B:
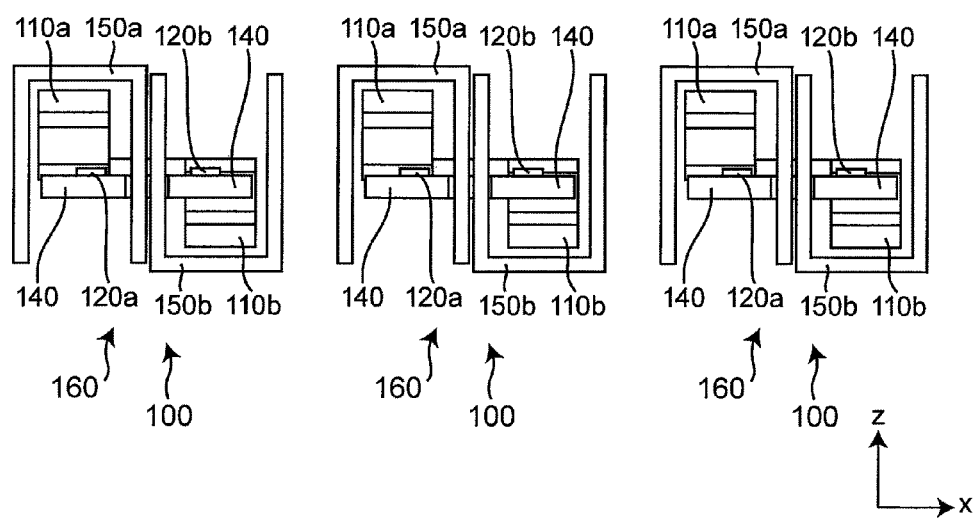
FIG. 20B is a cross-sectional view of the current sensor unit (the housing is not illustrated) illustrated in FIG. 20A when viewed from a direction of arrows on a line XXB-XXB.

FIG. 19A is a perspective view illustrating an external appearance of a current sensor unit for measuring a three-phase AC current according to a seventh preferred embodiment, FIG. 19B is a cross-sectional view of the current sensor unit illustrated in FIG. 19A when viewed from a direction of arrows on a line XIXB-XIXB. FIG. 20A is a perspective view illustrating an external appearance of the current sensor unit (a housing is not illustrated) according to the seventh preferred embodiment, and FIG. 20B is a cross-sectional view of the current sensor unit (the housing is not illustrated) illustrated in FIG. 20A when viewed from a direction of arrows on a line XXB-XXB.

As illustrated in FIG. 19A to FIG. 20B, a current sensor unit 700 of the seventh preferred embodiment includes a plurality of the current sensors 100. The plurality of current sensors 100 is molded with a resin 765, and disposed such that the respective conductors 110 are arrayed in parallel or substantially in parallel. In particular, the plurality of current sensors 100 is disposed such that the first flow path portions 110a and the second flow path portions 110b of the current sensors 100 different from one another are arrayed in parallel or substantially in parallel, that is, the magnetic sensor units 160 are arrayed in parallel or substantially in parallel to one another.

According to the current sensor unit 700 of the seventh preferred embodiment, it is possible to improve resistance against the disturbance magnetic field from the current sensors of other phases, in each of the current sensors 100. In addition, it is possible to reduce the influence of the magnetic field of each of the current sensors 100 as the disturbance magnetic field on the current sensors of the other phases. Therefore, a distance between the current sensors 100 is able to be set smaller, and thus the current sensor unit 700 is able to be reduced in size.

In the above-described preferred embodiments, the first magnetic sensor 120a or 220a and the second magnetic sensor 120b or 220b may be mounted in separate packages, or may be mounted in one package. Further, the first magnetic sensor 120a or 220a and the second magnetic sensor 120b or 220b may be integrated into separate IC chips, or may be integrated into one IC chip. By providing the first magnetic sensor 120a or 220a and the second magnetic sensor 120b or 220b on the same IC chip, it is possible to bring the characteristics thereof close to each other.

Additionally, electronic components, such as the amplifying portion 130, may be mounted in the one package together with the first magnetic sensor 120a or 220a and the second magnetic sensor 120b or 220b.

The present invention is not limited to the above-described preferred embodiments, and changes, substitutions, additions, omissions, and the like may be appropriately made in each of the preferred embodiments. Further, it is also possible to combine the elements described in the above preferred embodiments to provide a new preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor to output an output signal based on a magnitude of a current to be measured, the current sensor comprising:
    a conductor including a first flow path portion and a second flow path portion that are branched, the conductor branching into the first flow path portion and the second flow path portion, the first flow path portion being a portion in which a first portion of the current to be measured flows and the second flow path portion being a portion in which a second portion of the current flows;
    a first magnetic detector to detect a strength of a first magnetic field generated by the current flowing in the first flow path portion;
    a second magnetic detector to detect a strength of a second magnetic field generated by the current flowing in the second flow path portion; and
    a magnetic shield disposed between the first flow path portion and the second flow path portion and between the first magnetic detector and the second magnetic detector, and includes a magnetic material.

2. The current sensor according to claim 1, wherein the magnetic shield is defined by a single unitary structure made of a magnetic material.

3. A current sensor unit comprising:
    a plurality of the current sensors according to claim 1; wherein
    the plurality of current sensors is disposed such that the respective conductors are arrayed in parallel or substantially in parallel.

4. The current sensor unit according to claim 3, wherein the plurality of current sensors are disposed such that, among the plurality of current sensors, a first flow path portion of a first current sensor and a second flow path portion of a second current sensor different from the first current sensor are arrayed in parallel or substantially in parallel.

5. The current sensor unit according to claim 3, wherein in each of the plurality of current sensors, the magnetic shield includes:
    a central side wall portion between the first flow path portion and the second flow path portion and between the first magnetic detector and the second magnetic detector; and a first connecting wall portion facing the first magnetic detector with the first flow path portion interposed therebetween, and connected to the central side wall portion at a first side portion of the central side wall portion.

6. The current sensor unit according to claim 5, wherein, in each of the plurality of current sensors, the magnetic shield further includes a second connecting wall portion facing the second magnetic detector with the second flow path portion interposed therebetween, and connected to the central side wall portion at a second side portion on an opposite side from the first side portion of the central side wall portion.

7. The current sensor unit according to claim 6, wherein, in each of the plurality of current sensors, in the magnetic shield, the first connecting wall portion, the central side wall portion, and the second connecting wall portion are integrally connected.

8. The current sensor unit according to claim 6, wherein in each of the plurality of current sensors, the magnetic shield includes a first magnetic shield portion and a second magnetic shield portion, the central side wall portion includes a first central side wall portion and a second central side wall portion facing the first central side wall portion, the first magnetic shield portion includes the first central side wall portion and the first connecting wall portion connected to the first central side wall portion, and has an L-shaped or substantially L-shaped cross section, and the second magnetic shield portion includes the second central side wall portion and the second connecting wall portion connected to the second central side wall portion, and has an L-shaped or substantially L-shaped cross section.

9. The current sensor unit according to claim 8, wherein, in each of the plurality of current sensors, the first magnetic shield portion further includes a first outer side wall portion facing the first central side wall portion with the first flow path portion and the first magnetic detector interposed therebetween and connected to the first connecting wall portion, and has a U-shaped or substantially U-shaped cross section.

10. The current sensor unit according to claim 9, wherein, in each of the plurality of current sensors, the second magnetic shield portion further includes a second outer side wall portion facing the second central side wall portion with the second flow path portion and the second magnetic detector interposed therebetween and connected to the second connecting wall portion, and has a U-shaped or substantially U-shaped cross section.

11. The current sensor unit according to claim 10, wherein in each of the plurality of current sensors, the first flow path portion has a plate shape including a main surface, the first connecting wall portion has a plate shape including a main surface, and the first flow path portion and the first connecting wall portion are disposed such that the main surfaces of the first flow path portion and the first connecting wall portion are parallel or substantially parallel to each other.

12. The current sensor unit according to claim 11, wherein in each of the plurality of current sensors, the second flow path portion has a plate shape including a main surface, the second connecting wall portion has a plate shape including a main surface, and the second flow path portion and the second connecting wall portion are disposed such that the main surfaces of the second flow path portion and the second connecting wall portion are parallel or substantially parallel to each other.

13. A current sensor to output an output signal based on a magnitude of a current to be measured, the current sensor comprising:
a conductor including a first flow path portion and a second flow path portion that are branched, the first flow path portion being a portion in which a first portion of the current to be measured flows and the second flow path portion being a portion in which a second portion of the current flows;
a first magnetic detector to detect a strength of a first magnetic field generated by the current flowing in the first flow path portion;
a second magnetic detector to detect a strength of a second magnetic field generated by the current flowing in the second flow path portion; and
a magnetic shield disposed between the first flow path portion and the second flow path portion and between the first magnetic detector and the second magnetic detector, and includes a magnetic material; wherein
the magnetic shield includes:
a central side wall portion between the first flow path portion and the second flow path portion and between the first magnetic detector and the second magnetic detector; and
a first connecting wall portion facing the first magnetic detector with the first flow path portion interposed therebetween, and connected to the central side wall portion at a first side portion of the central side wall portion.

14. The current sensor according to claim 13, wherein the magnetic shield further includes a second connecting wall portion facing the second magnetic detector with the second flow path portion interposed therebetween, and connected to the central side wall portion at a second side portion on an opposite side from the first side portion of the central side wall portion.

15. The current sensor according to claim 14, wherein, in the magnetic shield, the first connecting wall portion, the central side wall portion, and the second connecting wall portion are integrally connected.

16. The current sensor according to claim 14, wherein
the magnetic shield includes a first magnetic shield portion and a second magnetic shield portion;
the central side wall portion includes a first central side wall portion and a second central side wall portion facing the first central side wall portion;
the first magnetic shield portion includes the first central side wall portion and the first connecting wall portion connected to the first central side wall portion, and has an L-shaped or substantially L-shaped cross section; and
the second magnetic shield portion includes the second central side wall portion and the second connecting wall portion connected to the second central side wall portion, and has an L-shaped or substantially L-shaped cross section.

17. The current sensor according to claim 16, wherein the first magnetic shield portion further includes a first outer side wall portion facing the first central side wall portion with the first flow path portion and the first magnetic detector interposed therebetween and connected to the first connecting wall portion, and has a U-shaped or substantially U-shaped cross section.

18. The current sensor according to claim 17, wherein the second magnetic shield portion further includes a second outer side wall portion facing the second central side wall portion with the second flow path portion and the second magnetic detector interposed therebetween and connected to the second connecting wall portion, and has a U-shaped or substantially U-shaped cross section.

19. The current sensor according to claim 18, wherein
the first flow path portion has a plate shape including a main surface;
the first connecting wall portion has a plate shape including a main surface; and
the first flow path portion and the first connecting wall portion are disposed such that the main surfaces of the first flow path portion and the first connecting wall portion are parallel or substantially parallel to each other.

20. The current sensor according to claim 19, wherein
the second flow path portion has a plate shape including a main surface;
the second connecting wall portion has a plate shape including a main surface; and
the second flow path portion and the second connecting wall portion are disposed such that the main surfaces of the second flow path portion and the second connecting wall portion are parallel or substantially parallel to each other.

* * * * *